(12) United States Patent
Kume et al.

(10) Patent No.: US 10,037,930 B2
(45) Date of Patent: Jul. 31, 2018

(54) POWER SEMICONDUCTOR MODULE AND MANUFACTURING METHOD OF POWER SEMICONDUCTOR MODULE

(71) Applicant: Hitachi Automotive Systems, Ltd., Hitachinaka-shi, Ibaraki (JP)

(72) Inventors: Takashi Kume, Hitachinaka (JP); Takahiro Shimura, Hitachinaka (JP); Akira Matsushita, Hitachinaka (JP); Shinichi Fujino, Hitachinaka (JP); Yusuke Takagi, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 15/320,345

(22) PCT Filed: May 11, 2015

(86) PCT No.: PCT/JP2015/063408
§ 371 (c)(1),
(2) Date: Dec. 20, 2016

(87) PCT Pub. No.: WO2015/198720
PCT Pub. Date: Dec. 30, 2015

(65) Prior Publication Data
US 2017/0162472 A1    Jun. 8, 2017

(30) Foreign Application Priority Data
Jun. 26, 2014    (JP) .................................. 2014-131568

(51) Int. Cl.
*H01L 23/433*    (2006.01)
*H02M 7/00*    (2006.01)
(Continued)

(52) U.S. Cl.
CPC ........ *H01L 23/433* (2013.01); *H01L 21/4817* (2013.01); *H01L 21/4882* (2013.01);
(Continued)

(58) Field of Classification Search
CPC . H01L 23/433; H01L 23/043; H01L 21/4817; H01L 21/4882; H01L 25/18; H02M 7/003; H02M 7/44
(Continued)

(56) References Cited

U.S. PATENT DOCUMENTS

2007/0096278 A1*  5/2007  Nakatsu .............. H01L 23/3675
                                                          257/678
2009/0065178 A1   3/2009  Kasezawa et al.
(Continued)

FOREIGN PATENT DOCUMENTS

| JP | 2006-324647 A | 11/2006 |
|----|---------------|---------|
| JP | 2012-257369 A | 12/2012 |
| JP | 2013-4765 A   | 1/2013  |

OTHER PUBLICATIONS

Japanese-language Office Action issued in counterpart Japanese Application No. 2016-529164 dated Aug. 29, 2017 with English translation (6 pages).
(Continued)

*Primary Examiner* — Cuong Q Nguyen
*Assistant Examiner* — Tong-Ho Kim
(74) *Attorney, Agent, or Firm* — Crowell & Moring LLP

(57) ABSTRACT

An object of the present invention is to provide a power semiconductor module that can secure a satisfactory cooling without expanding the size of a case component. In the power semiconductor module according to the present invention, a frame case includes a front surface, a back surface, and a pair of side surfaces and formed with an opening part in at least one of the front surface and the back
(Continued)

surface. A metal base is inserted into the opening part of the frame case. A frame case is provided with a joining part FW to which the peripheral part of the metal base and the peripheral part of the opening part of the frame case are joined. A first concaved part and a second concaved part are formed respectively in each of a pair of side surfaces of the frame case. Each of the concaved parts is prolonged toward an inner side of the frame case from the side surfaces, and includes a bottom surface formed facing the joining part FW side in an intermediate position of the thickness direction of each of the side surfaces.

11 Claims, 30 Drawing Sheets

(51) Int. Cl.
    *H01L 25/18*     (2006.01)
    *H02M 7/44*     (2006.01)
    *H01L 23/043*     (2006.01)
    *H01L 21/48*     (2006.01)

(52) U.S. Cl.
    CPC ............ *H01L 23/043* (2013.01); *H01L 25/18* (2013.01); *H02M 7/003* (2013.01); *H02M 7/44* (2013.01)

(58) Field of Classification Search
    USPC .................................................. 257/713, 678
    See application file for complete search history.

(56) References Cited

U.S. PATENT DOCUMENTS

| | | |
|---|---|---|
| 2014/0098588 A1 | 4/2014 | Kaneko et al. |
| 2014/0225249 A1 | 8/2014 | Yoshihara et al. |
| 2015/0245523 A1* | 8/2015 | Takagi .................. H02M 7/003 361/715 |

OTHER PUBLICATIONS

International Search Report (PCT/ISA/210) issued in PCT Application No. PCT/JP2015/063408 dated Jul. 28, 2015 with English translation (3 pages).
Japanese-language Written Opinion (PCT/ISA/237) issued in PCT Application No. PCT/JP2015/063408 dated Jul. 28, 2015 (3 pages).

* cited by examiner

POWER SEMICONDUCTOR MODULE AND MANUFACTURING METHOD OF POWER SEMICONDUCTOR MODULE

TECHNICAL FIELD

The present invention relates to a power semiconductor module and a manufacturing method of a power semiconductor module, specifically, to a power semiconductor module including and a power converting circuit and a manufacturing method thereof.

BACKGROUND ART

A power semiconductor module used for vehicles such as automobiles, has a power converting circuit which converts direct current power into alternating current power or alternating current power into direct current power. The power converting circuit is equipped with a power semiconductor element having large heat value.

For this reason, a case of the power semiconductor module is usually formed with metal. The case is equipped with accommodating space for accommodating a circuit unit including an electronic component such as a power semiconductor element.

As an example of such a power semiconductor module case, a following method is known: fitting a heat sink formed with a large number of radiating fins to an opening part formed in a metal frame object; and joining a matching part of the heat sink and the peripheral part of the opening part of the metal frame object by friction stir welding (see PTL 1, for example).

CITATION LIST

Patent Literature

PTL 1: JP 2012-257369 A

SUMMARY OF INVENTION

Technical Problem

The accommodating space of the power semiconductor module needs to be formed in a strict dimension such that the circuit unit and the heat sink cohere uniformly for securing a satisfactory cooling. For this purpose, it is necessary to fix the case certainly so that position of the case does not change at the time of joining.

In a structure described in PTL 1, since the width of the peripheral part of the opening part of the metal frame object is small, the metal frame object cannot be fixed certainly. However, if the width of the peripheral part of the opening part of the metal frame object has a sufficiently large size, the size of the power semiconductor module is expanded.

Solution to Problem

A power semiconductor module according to the present invention includes: a circuit unit including a first electrode for an input signal, a second electrode for an output signal, and a third electrode for a control signal, wherein the circuit unit further includes a power converting circuit that converts the input signal of the first electrode based on the control signal applied to the third electrode and outputs the output signal from the second electrode; and a case component, including a frame case made of metal and a metal base, that accommodates the circuit unit, wherein the frame case includes a front surface, a back surface, and a pair of side surfaces, wherein the frame case is formed with an opening part at least in one of the front surface or the back surface, the case component includes a joining part in which the peripheral part of the metal base inserted into the opening part of the frame case and the peripheral part of the opening part of the frame case are joined, and each of the pair of side surfaces of the frame case is formed with a concaved part, wherein the concaved part is prolonged toward an inner side of the case component from the side surface and includes a bottom surface formed facing the joining part side in an intermediate position of the thickness direction of the side surface.

Advantageous Effects of Invention

The present invention allows securing satisfactory cooling without expanding the size of a case component.

DESCRIPTION OF EMBODIMENTS

First Embodiment

Structure of Power Semiconductor Module

The power semiconductor module of the present invention and an embodiment of the power semiconductor module will be discussed in detail with reference to the drawings.

Figure 1:
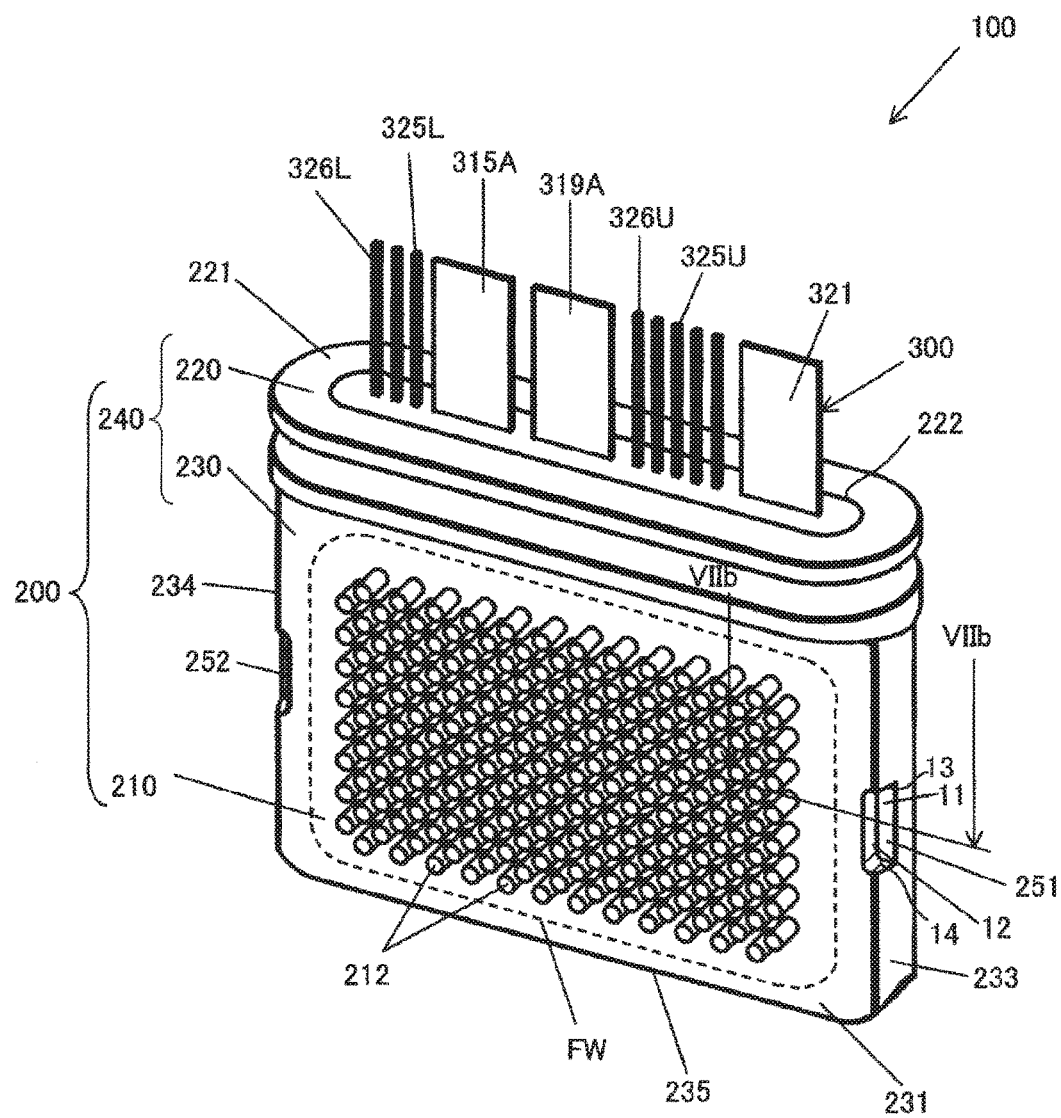
FIG. 1 is an appearance perspective view of a power semiconductor module according to an embodiment of the present invention.
Figure 1:
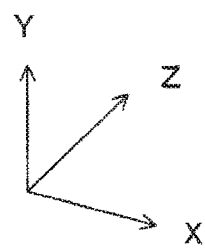
Figure 2:
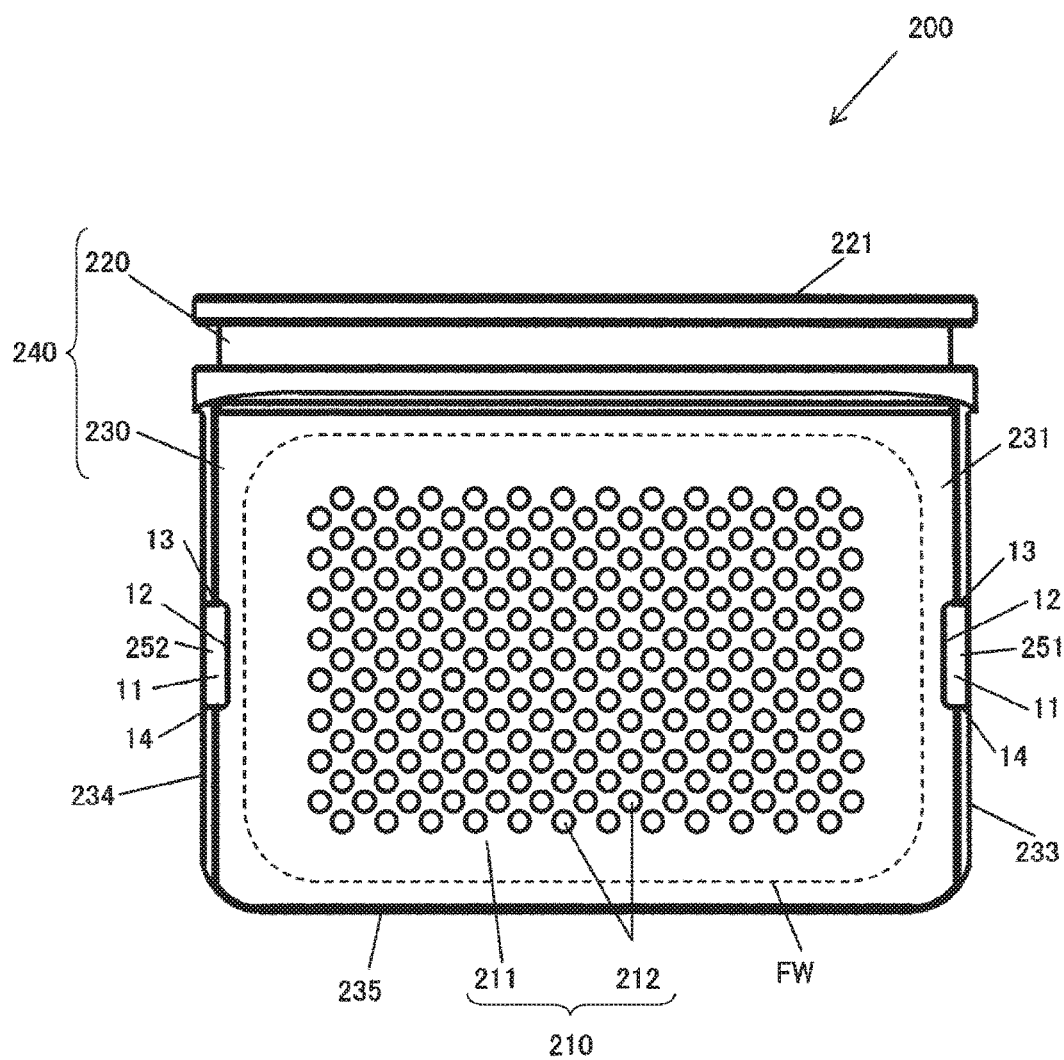
FIG. 2 is a front view of a case component of the power semiconductor module illustrated in FIG. 1.
Figure 2:
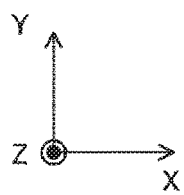
Figure 3:
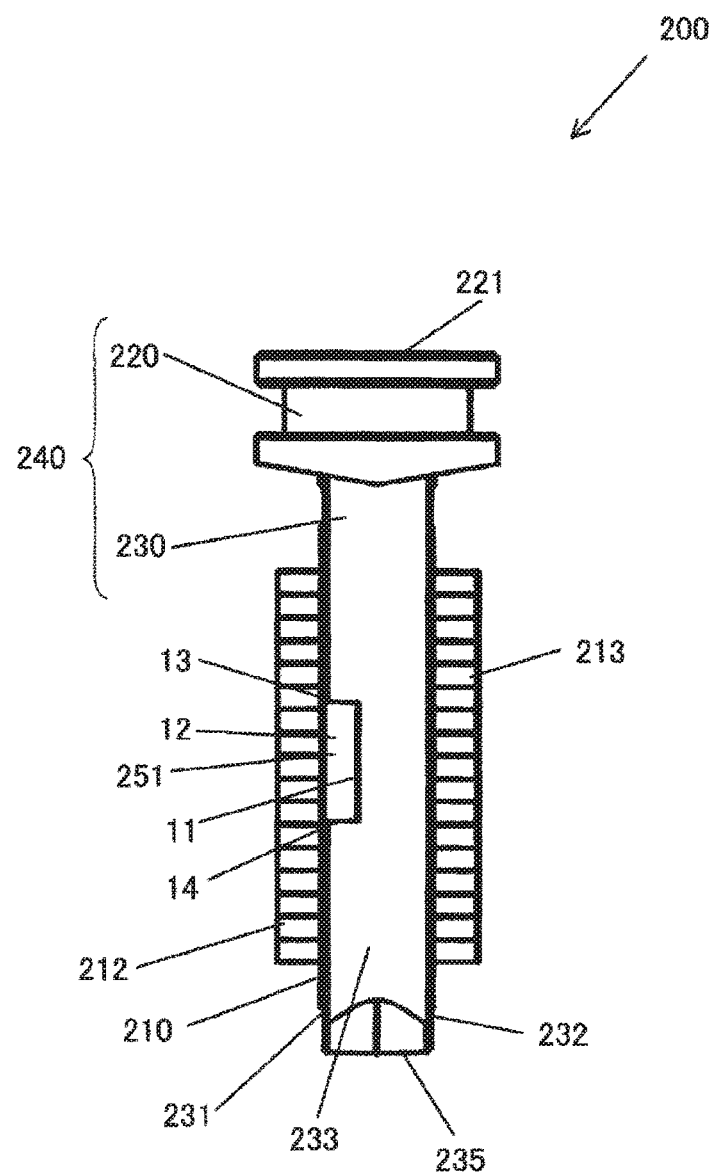
FIG. 3 is a right side view of the case component of the power semiconductor module illustrated in FIG. 1.
Figure 4:
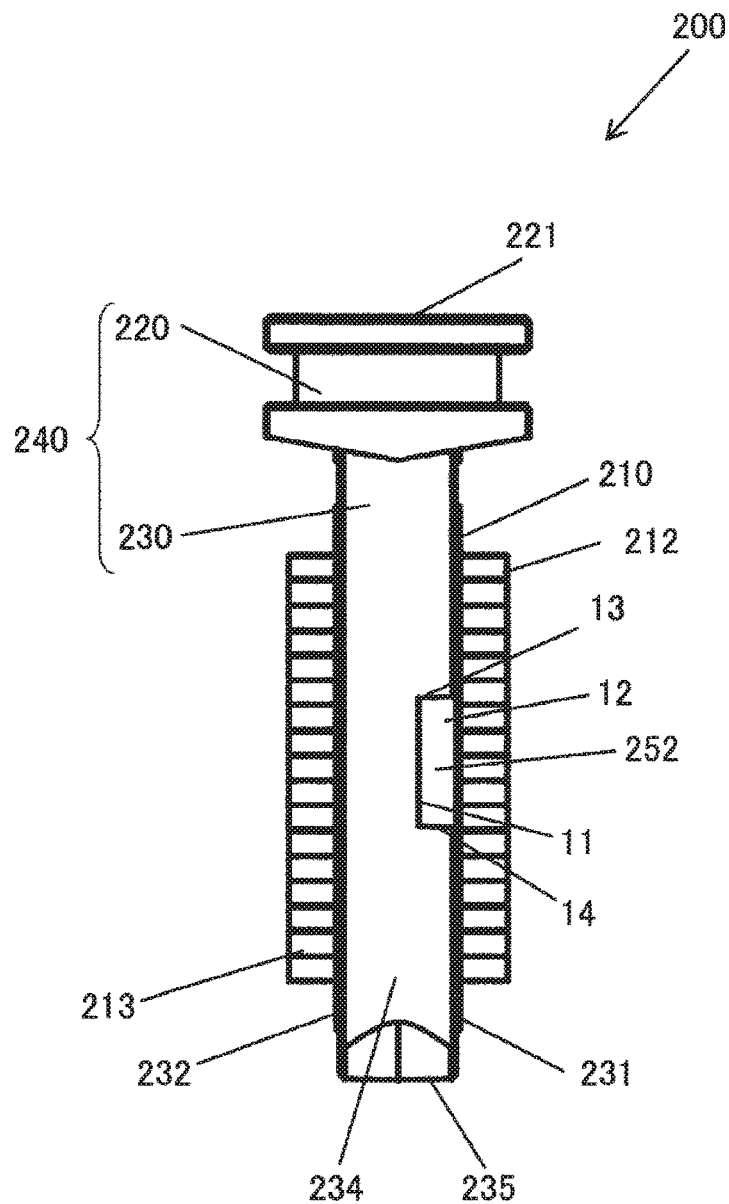
FIG. 4 is a left side view of the case component of the power semiconductor module illustrated in FIG. 1.
Figure 4:
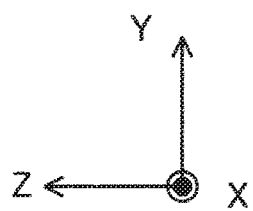
Figure 5:
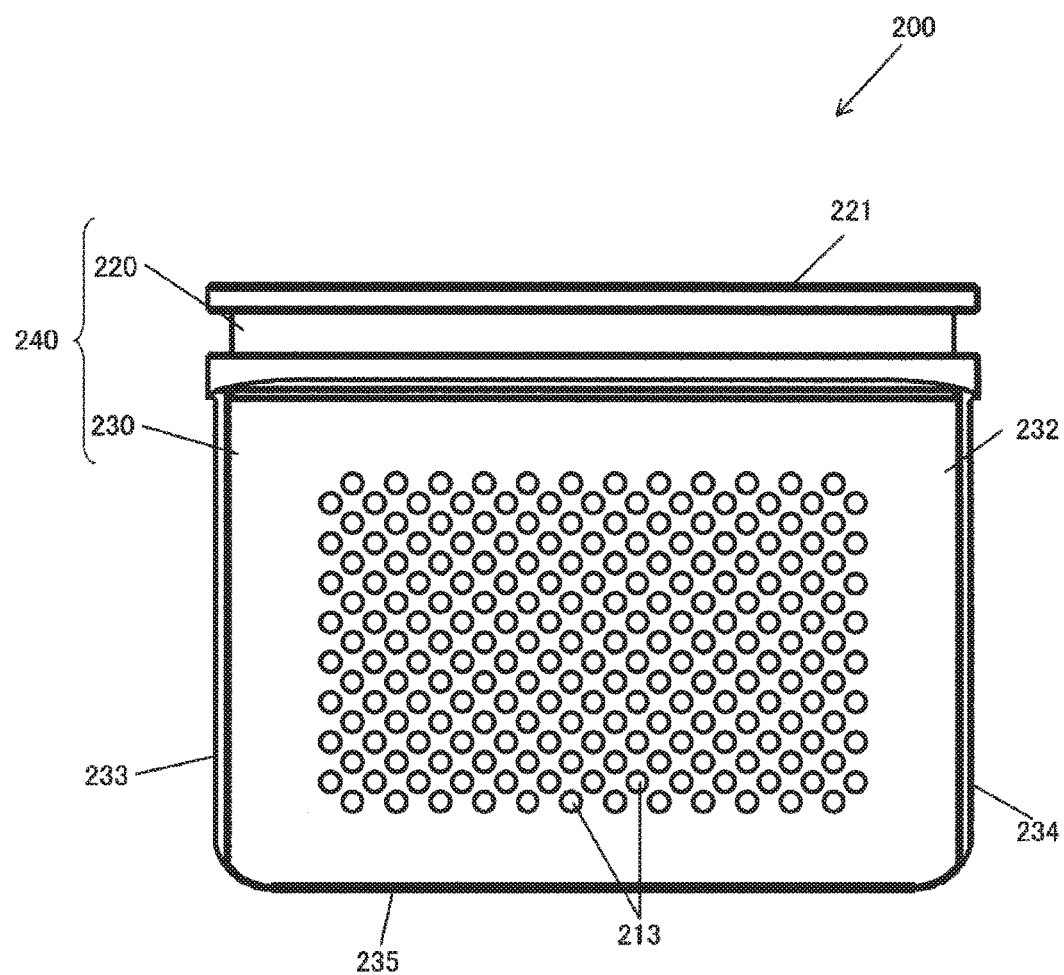
FIG. 5 is a rear side view of the case component of the power semiconductor module illustrated in FIG. 1.
Figure 6:
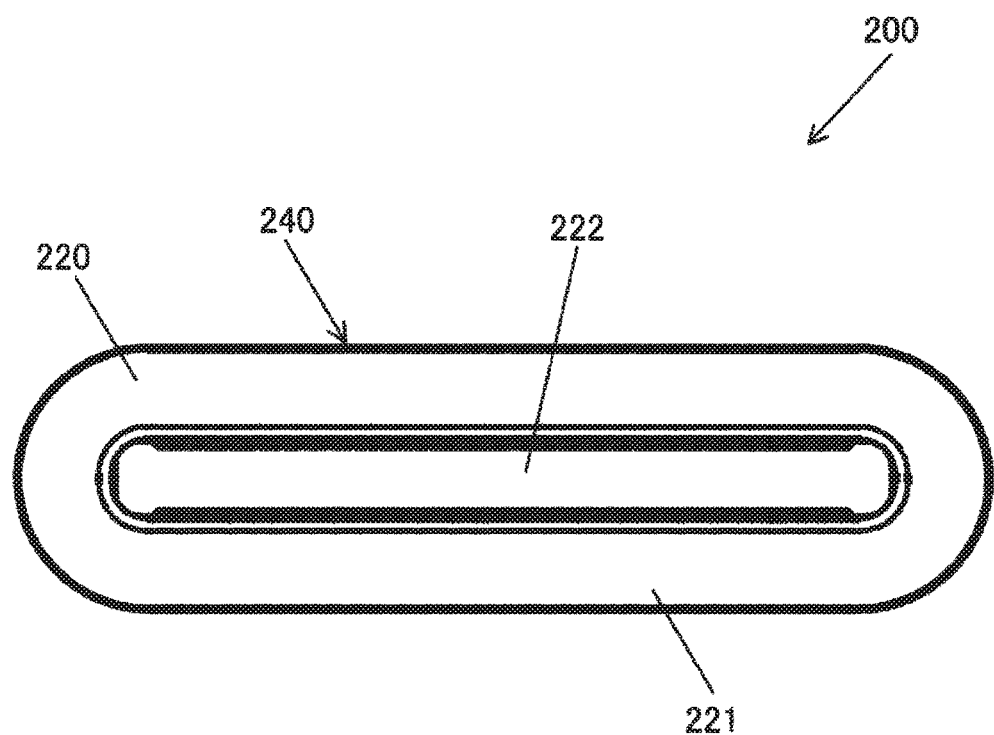
FIG. 6 is a plan view of the case component of the power semiconductor module illustrated in FIG. 1.
Figure 6:
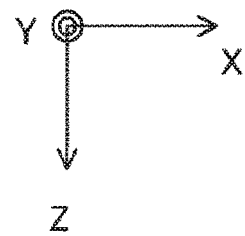

FIG. 1 is an appearance perspective view of a power semiconductor module according to an embodiment of the present invention. FIG. 2 through FIG. 7 are, respectively, front view, right side view, left side view, rear surface view, plan view, and under view of a case component of the power semiconductor module illustrated in FIG. 1. FIG. 8 is an exploded perspective view of the case component illustrated in FIG. 1.

A power semiconductor module 100 is mounted in vehicles such as hybrid cars and electric vehicles. The power semiconductor module 100 includes a case component 200 and a circuit unit 300.

The circuit unit 300 includes multiple power semiconductor elements, and is equipped with a power converting circuit which converts direct current power into alternating current power. The direct current power supplied from an alternator driven by a battery or an engine (not illustrated) is converted into alternating current power with a power converting circuit built in the circuit unit 300 of the power semiconductor module 100, and is supplied to a motor. A three phase bridge circuit including U-phase, V-phase, and W-phase can be configured by using three power semiconductor modules 100 and by connecting the circuit unit 300 of each power semiconductor module 100.

As illustrated in FIG. 8, the case component 200 is configured by joining a frame case 240 and a metal base 210. Both of the frame case 240 and the metal base 210 are formed of aluminum alloy material. For example, metal materials such as Al, AlSi, AlSiC, and Al—C are used.

The frame case 240 includes a flange part 220 and a frame part 230 formed under the flange part 220. The flange part 220 and the frame part 230 are formed integrally using aluminum die casting.

The embodiment will be discussed further with reference to FIG. 7(a), FIG. 7(b), and FIG. 8.

Figure 7A:
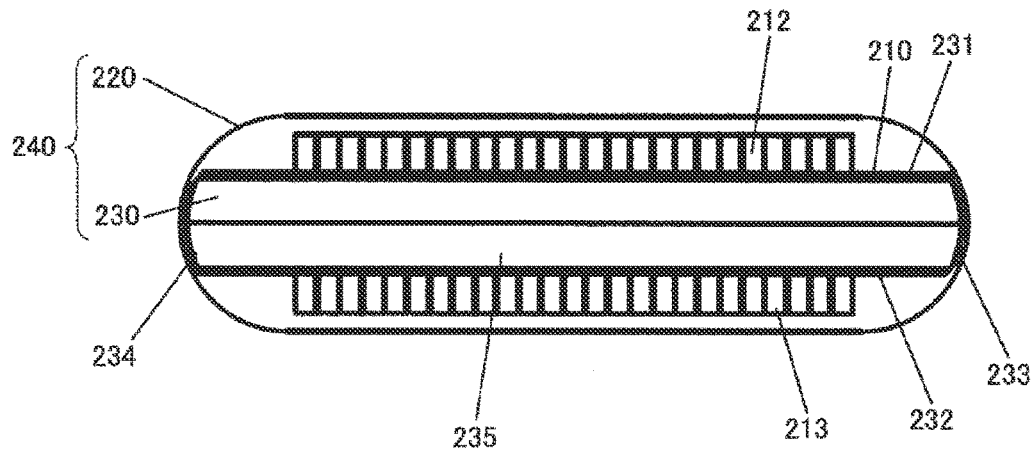
FIG. 7A is a under view of the case component of the power semiconductor module illustrated in FIG. 1.

FIG. 7(a) is a under view of the case component of the power semiconductor module illustrated in FIG. 1. FIG. 7(b) is an expanded sectional view on the VIIb-VIIb line of FIG. 1.

The frame part 230 includes a front surface 231, a back surface 232, a pair of side surfaces 233, 234, and an under surface 235, and has substantially rectangular parallelepiped geometry. An opening part 261, having substantially rectangular shape in plan view, is formed in the front surface 231 of the frame part 230. The opening part 261 has an opening edge part slightly inside the outer circumferential side of the front surface 231 of the frame part 230, and four corner parts thereof are trimmed circularly. A step part 262 is formed inside the opening part edge of the opening part 261. The step part 262 is formed by denting an outer surface side of the front surface 231 in the thickness direction, and by thinning the board thickness of this portion (see FIG. 11). A radiating fin 213 is formed on the back surface 232 of the frame part 230 (see FIG. 5 and FIG. 11).

The flange part 220 includes an upper part 221 which is oblong with both sides formed in semicircular arc. The flange part 220 connects the front surface 231, the back surface 232 and the pair of side surfaces 233, 234 of the frame part 230. An oblong penetration hole 222 is formed in the center part of the upper part 221.

An accommodation space for accommodating a circuit unit 300 is formed with the front surface 231, the back surface 232, the pair of side surfaces 233, 234, and the under surface 235 of the frame part 230. The penetration hole 222 of the flange part 220 communicates to the accommodation space. The circuit unit 300 is inserted from the penetration hole 222 of the flange part 220, and is accommodated in the accommodation space of the frame case 240 such that each terminal, discussed later, is projected upward from the flange part 220.

Figure 7B:
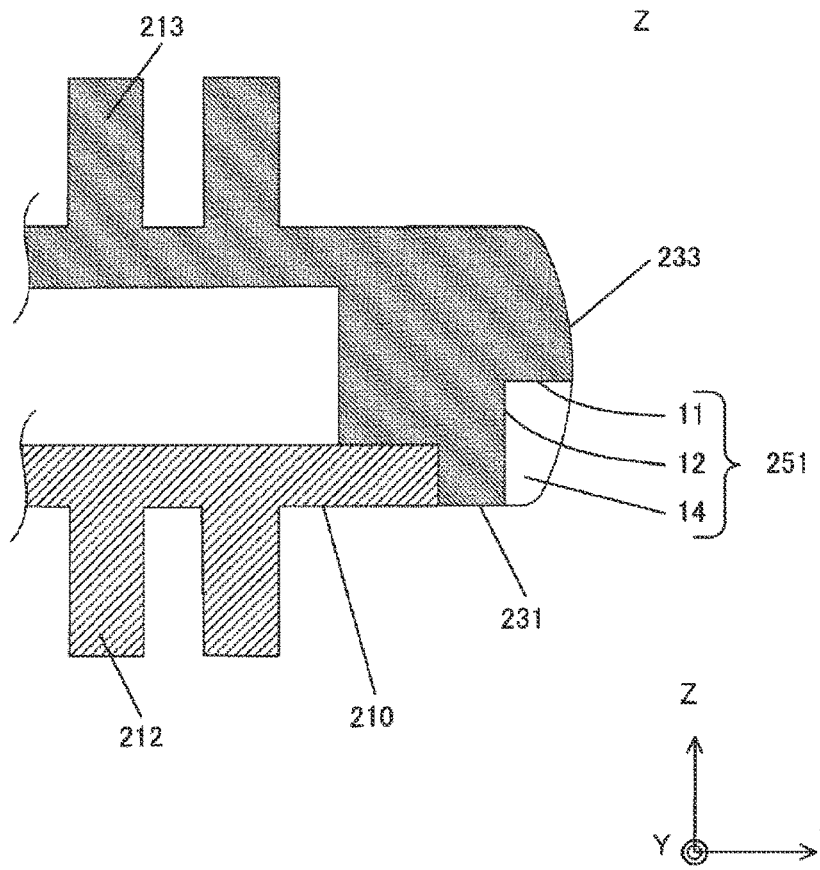
FIG. 7B is an expanded sectional view on the line of FIG. 1.
Figure 8:
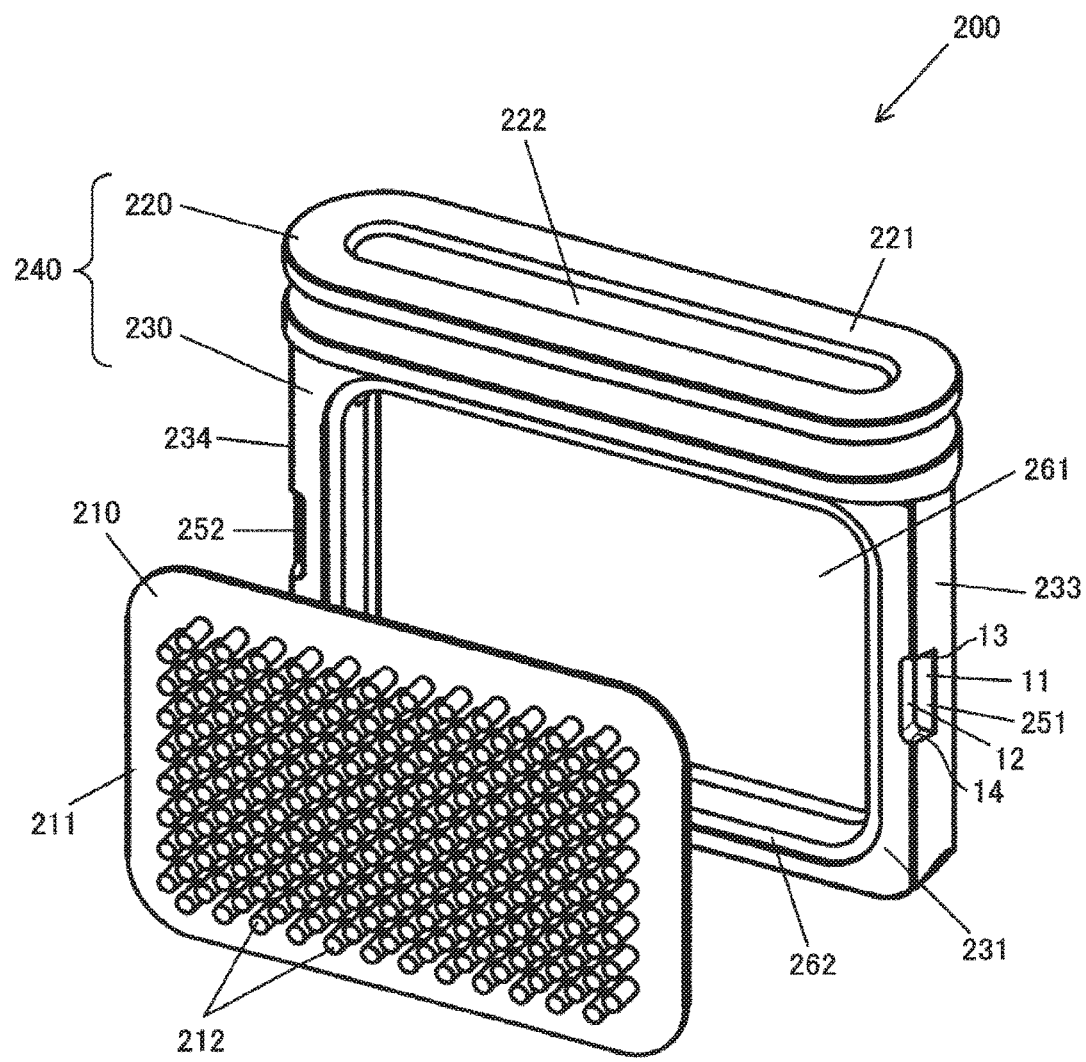
FIG. 8 is an exploded perspective view of the case component of the power semiconductor module illustrated in FIG. 1.

As illustrated in FIG. 7(a) and FIG. 7(b), each of the side surfaces 233, 234 of the frame part 230 is formed such that the center part of frame part 230 in the thickness direction (Z-direction) is curved circularly swelling outside. Here, "circular" includes partial configurations of long circle, ellipse, disk, and dome, in addition to a partial configuration of a complete circle.

As illustrated in FIG. 7(b) and FIG. 8, each of the side surfaces 233, 234 is formed, respectively, with a first concaved part 251 and a second concaved part 252 that are prolonged toward the inner direction of the frame part 230. Each of the first and second concaved parts 251, 252 is formed in substantially center of the frame part 230 in the height direction (Y-direction). The X-direction, Y-direction, and Z-direction are as illustrated in each of the drawings.

Each bottom surface 11 of the first and second concaved parts 251, 252 in the Z-direction is provided in a side closer to the front surface 231 compared to the intermediate position of each of the side surfaces 233, 234 in the thickness direction (Z-direction). That is, each bottom surface 11 of the first and second concaved parts 251, 252 is formed in a depth which does not reach the intermediate position in the thickness direction (Z-direction). Each of the length direction (X-direction) side end surfaces 12 of the first and second concaved parts 251, 252 of the frame part 230 is formed, respectively, inside a region of side surfaces 233, 234 curved circularly.

Thus, the first and second concaved parts 251, 252 are provided inside the region of the side surfaces 233, 234 curved circularly, and are opened respectively in the front surface 231 and the side surfaces 233, 234.

Each of the first and second concaved parts 251, 252 has end sides 13, 14 facing each other in the height direction (Y-direction).

The metal base 210 includes a plate part 211 which is substantially flat, and multiple radiating fins 212 having pillared shape that are formed projected from the plate part 211. The geometry of the outer circumference of the metal base 210 is formed so as to be inserted into the opening part 261 of the frame part 230. Although the detail will be discussed later, the metal base 210 is fit to the opening part 261 of the frame part 230, as well as being installed on the step part 262. In this state, the peripheral part of the plate part 211 and the peripheral part of the opening part 261 of the frame part 230 are joined.

As illustrated by the dotted line in FIG. 1, the metal base 210 is formed in the front surface 231 of the case component 200. For example, a frame-shaped joining part FW joined by friction stir welding is formed.

Circuit Configuration of Circuit Unit

The circuit unit 300 is built-in with a power semiconductor element, which is a power converting circuit that converts direct current power into alternating current power or converts alternating current power into direct current power.

Figure 9:
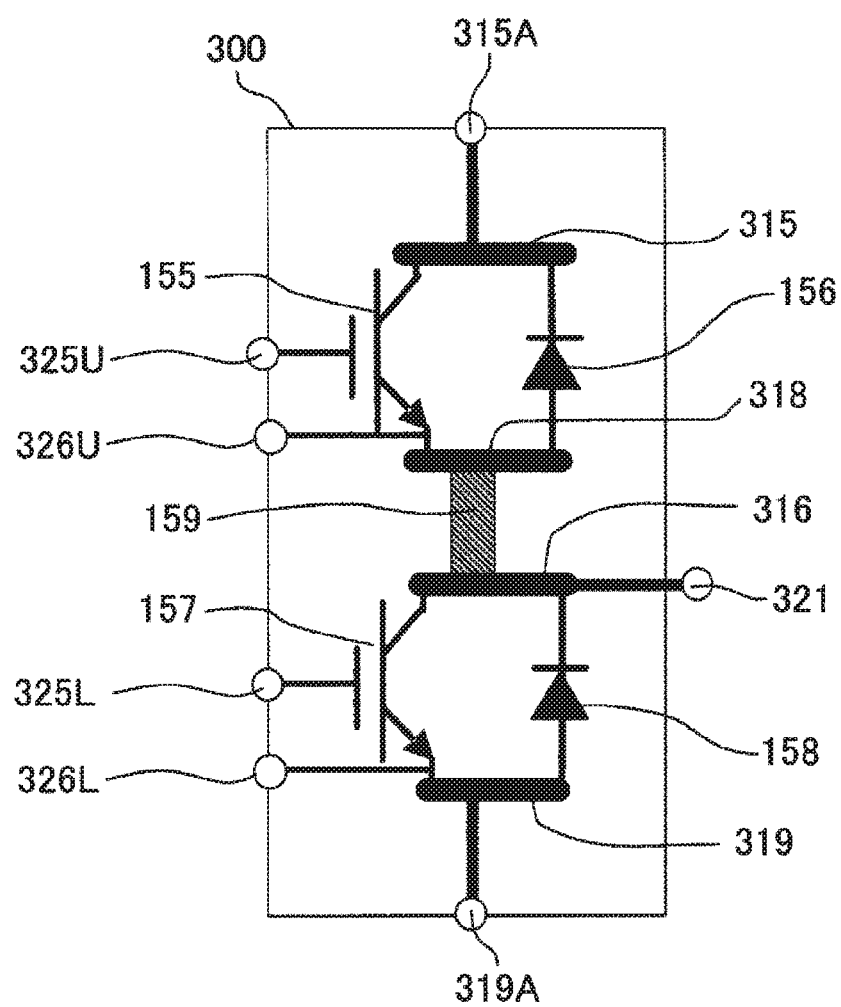
FIG. 9 is a circuit diagram illustrating an example of a power semiconductor module circuit of the present invention.

FIG. 9 is a circuit diagram illustrating an example of a power semiconductor module circuit of the present invention.

The circuit unit 300 includes power a semiconductor element such as an upper arm IGBT 155, an upper arm diode 156, a lower arm IGBT 157, and a lower arm diode 158.

Gate electrode of the upper arm IGBT 155 and gate electrode of the lower arm IGBT 157 are connected, respectively, with an upper arm gate terminal 325U and a lower arm gate terminal 325L. Emitter electrode of the upper arm IGBT 155 and emitter electrode of the lower arm IGBT 157 are connected, respectively, with an upper arm emitter terminal 326U and a lower arm emitter terminal 326L.

Collector electrode of the upper arm IGBT 155 and cathode electrode of the upper arm diode 156 are connected by a direct current anode conductor board 315. The direct current anode conductor board 315 is connected to the direct current anode terminal 315A. Emitter electrode of the upper arm IGBT 155 and anode electrode of the upper arm diode 156 are connected by a second alternating current conductor board 318.

Emitter electrode of the lower arm IGBT 157 and anode electrode of the lower arm diode 158 are connected by a direct current cathode conductor board 319. The direct current cathode conductor board 319 is connected to a direct current cathode terminal 319A. Collector electrode of the lower arm IGBT 157 and cathode electrode of the lower arm diode 158 are connected by a first alternating current conductor board 316.

The first alternating current conductor board 316 and the second alternating current conductor board 318 are connected by an intermediate conductor board 159.

The first alternating current conductor board 316 is connected to an alternating current output terminal 321.

The reference numbers given to each terminal of the circuit unit 300 illustrated in FIG. 1 are the same with the reference numbers of the above mentioned each terminal illustrated in FIG. 9.

Accommodation Structure of Circuit Unit

The structure of the circuit unit 300 (not illustrated) is outlined as follows.

As illustrated in FIG. 9, the upper arm IGBT 155 and the upper arm diode 156 are sandwiched between the direct current anode conductor board 315 and the second alternating current conductor board 318 heat connected with each conductor board 315, 318, and are formed as a first semiconductor block. The lower arm IGBT 157 and the lower arm diode 158 are sandwiched between the alternating current output terminal 321 and the direct current cathode conductor board 319 heat connected with each of the conductor boards 321, 319, and are formed as a second semiconductor block. The first alternating current conductor board 316 and the second alternating current conductor board 318 are connected by the intermediate conductor board 159. The first semiconductor block and the second semiconductor block are arranged aligned inside a metallic mold such that the direct current anode conductor board 315 is in the same plane as the first alternating current conductor board 316, and are sealed by mold fabrication with terminals 315A, 325U, 326U, 319A, 321, 325L, 326L exposed. In one surface side, the direct current anode conductor board 315 and the first alternating current conductor board 316 are in the same surface with an outer surface of the resin, and are exposed from the resin. In the other surface side, the second alternating current conductor board 318 and the direct current cathode conductor board 319 are in the same surface with an outer surface of the resin, and are exposed from the resin.

That is, the circuit unit 300 is exposed outside such that the conductor boards, heat connected with the power semiconductor element, are in the same surfaces with the front and back surfaces of the sealing resin.

The circuit unit 300 is inserted from the penetration hole 222 of the case component 200, and is accommodated inside the accommodation space of the case component 200. The conductor boards formed in both front and back surfaces of the circuit unit 300 contact an internal surface of the metal base 210 and an internal surface of the back surface 232 of the frame case 240 heat conductively, in a state of being accommodated in the accommodation space. Although it is not illustrated, the heat connection can be made with a heat conduction sheet intervened between the circuit unit 300 and the metal base 210, and between the circuit unit 300 and the inner surface of the back surface 232 of the frame case 240.

In such a structure, when intervals between the inner surface of the metal base 210 and the inner surface of the back surface 232 of the frame case 240 are ununiformed in the thickness direction (Z-direction), crevices may occur between the circuit unit 300 and the metal base 210 or between the circuit unit 300 and the back surface 232 of the frame case 240. Or otherwise, the contact becomes ununiformed. Thus, capability for cooling the circuit unit 300 is decreased. Specifically, when the frame case 240 is fixed uncertainly at the time of joining, the frame case 240 is displaced when the metal base 210 is joined to the frame case 240 using a joining tool 25. In such a case, intervals between the inner surface of the metal base 210 and the inner surface of the back surface 232 of the frame case 240 becomes ununiformed in the thickness direction (Z-direction).

In order to secure the fixation of the frame case 240 at the time of the joining, one idea is to make the length longer between the opening edge part of the opening part 261 of the frame part 230 and the outer circumferential sides of the side surfaces 233, 234 of the frame part 230. However, the size of the frame case 240, or the case component 200, is expanded in this case.

Hereinafter, an embodiment of a manufacturing method of a power semiconductor module according to the present invention will be discussed. This method allows fixing the frame case 240 certainly and allows joining the frame case 240 and the metal base 210 with a sufficient accuracy without expanding the size of the case component 200.

Manufacturing Method of Power Semiconductor Module

Figure 10:
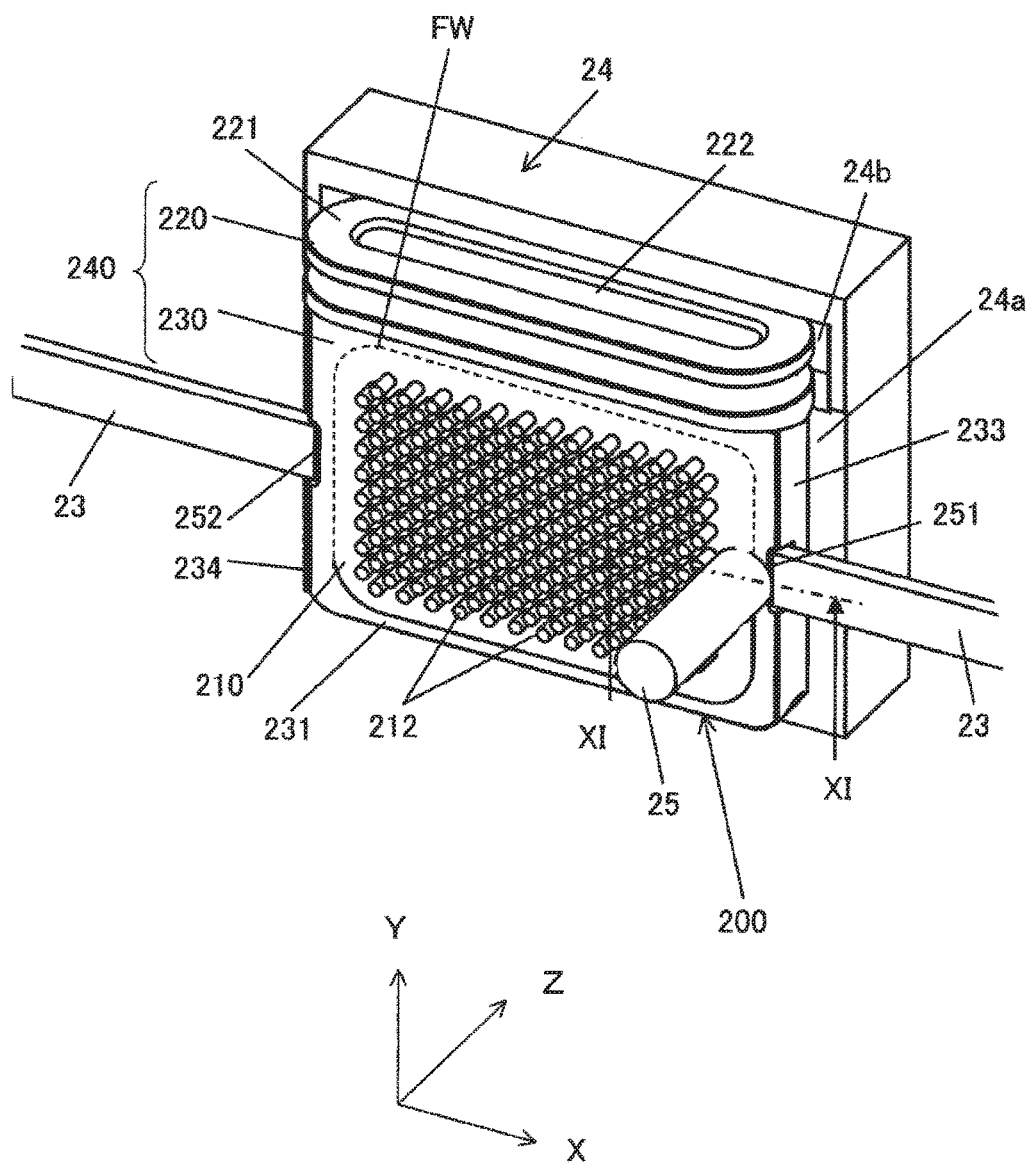
FIG. 10 is a perspective view for illustrating a manufacturing method of the case component of the power semiconductor module illustrated in FIG. 1.
Figure 11:
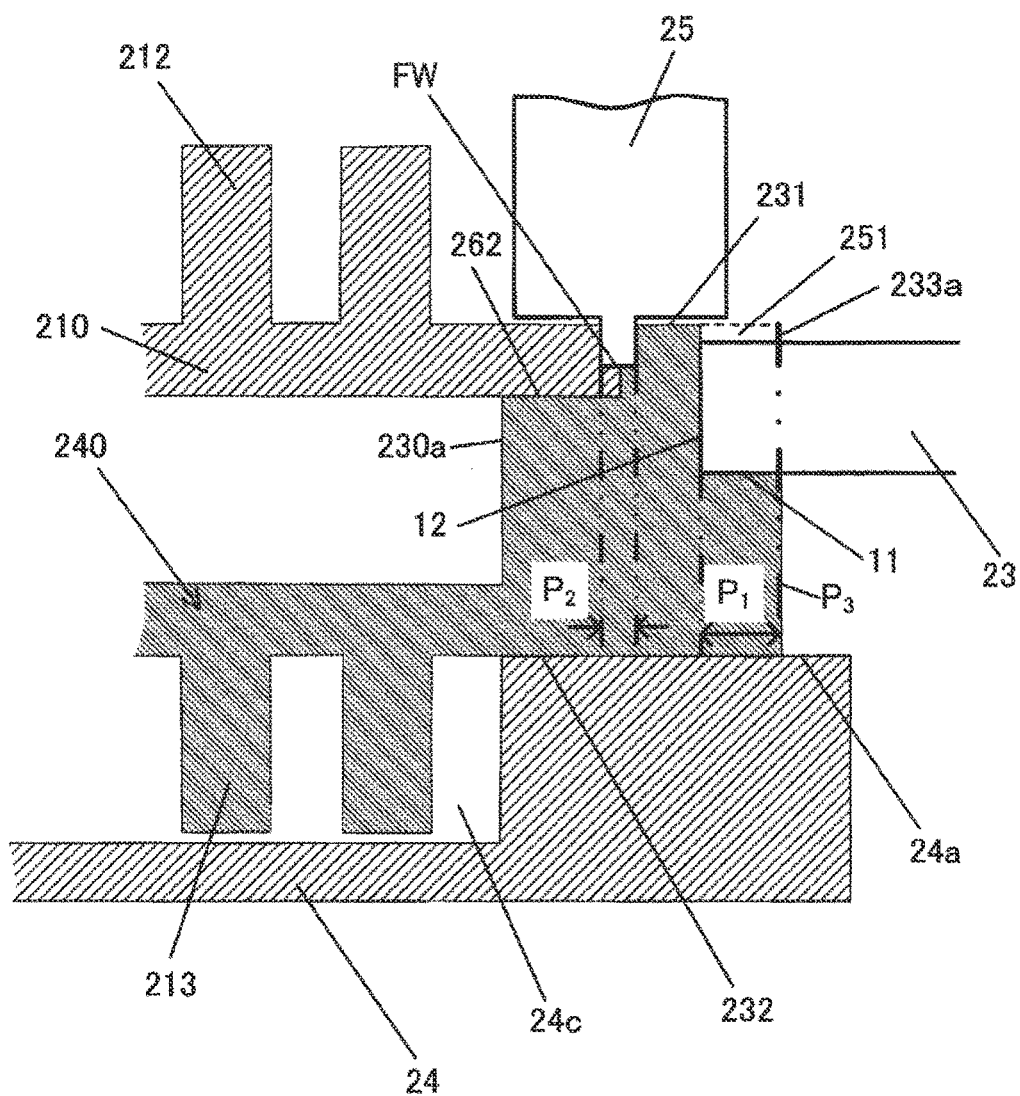
FIG. 11 is a sectional view on the XI-XI line of FIG. 10.
Figure 12:
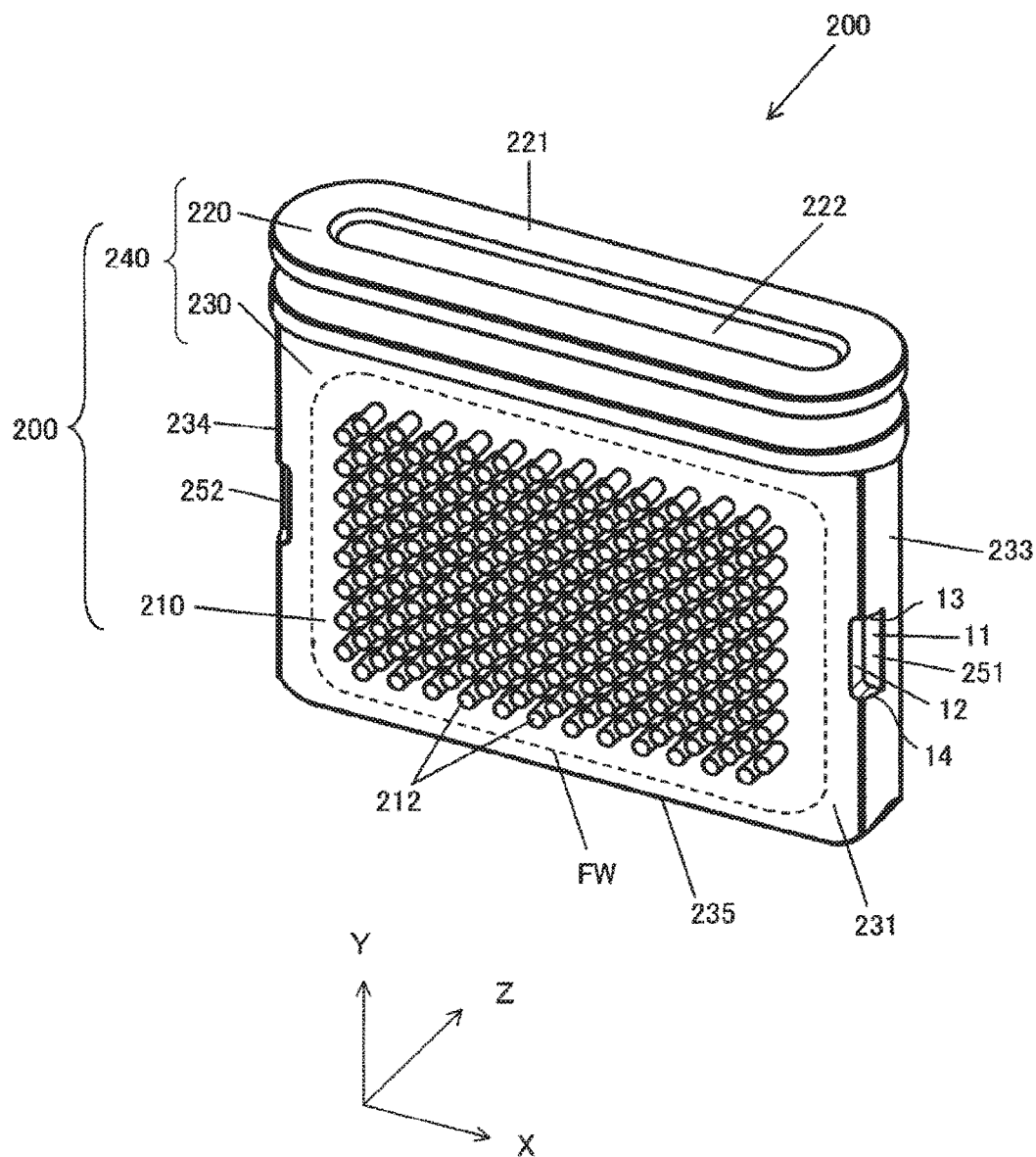
FIG. 12 is an appearance perspective view illustrating a completion state of a case component fabricated by a manufacturing method illustrated in FIG. 10 and FIG. 11.

FIG. 10 is a perspective view for illustrating a manufacturing method of the case component of the power semiconductor module illustrated in FIG. 1. FIG. 11 is a sectional view on the XI-XI line of FIG. 10. FIG. 12 is an appearance perspective view illustrating a completion state of the case component 200 fabricated by the manufacturing method illustrated in FIG. 10 and FIG. 11.

As discussed above, in order to fabricate the power semiconductor module 100 with large capability while achieving uniform cooling of the circuit unit 300, the case component 200 shall be fabricated such that the metal base 210 is joined to the frame case 240 without displacing the frame case 240.

In order to fabricate the case component 200, first, the frame case 240 is supported by a receiving fixture 24. The receiving fixture 24 is formed substantially in a rectangular shape, and includes a support surface 24a and a groove part 24b. In the support surface 24a, a concaved part 24c (see FIG. 11) is formed in a region corresponding to the radiating fin 213 provided in the back surface 232 of the frame case 240. The radiating fin 213 is arranged inside this concaved part 24c, and the rear surface 232 of the frame case 240 is installed on the support surface 24a. Inside the groove part 24b of the receiving fixture 24, accommodated is a part projected from the back surface 232 of the flange part 220.

In this state, the opening part 261 of the frame case 240 is arranged on the upper part side which is in the opposite side of the receiving fixture 24. The plate part 211 of the metal base 210 is inserted into the opening part 261 of the frame case 240, and is installed on the step part 262 formed in the peripheral part of the opening part 261. The installation side of the metal base 210 in the step part 262 can be a casting surface, or can be cut processed as necessity. In a state where the metal base 210 is installed on the step part 262, the depth of the step part 262 and the thickness of the plate part 211 shall be set so that an upper surface of the metal base 210 is in substantially same surface with an upper surface of the front 231 of the frame part 230.

The frame case 240 is fixed by forcing each bottom surface 11 of the first concaved part 251 formed in the surface side 233 and the second concaved part 252 formed in the side surface 234 of the frame case 240 using the fixture 23. The frame case 240 shall be fixed in the X, Y, and Z-directions. The frame case 240 is fixed in the Z-direction by forcing the bottom surfaces 11 of the first and second concaved parts 251, 252 to the receiving fixture 24 with the fixture 23. The frame case 240 is fixed in the X-direction by contacting the front tip surfaces of each fixture 23 to the side end surfaces 12 of the first and second concaved parts 251, 252. The frame case 240 is fixed in the Y-direction by forcing the side surfaces of each fixture 23 to the end sides 13, 14 of the first and second concaved parts 251, 252. In this case, the fixture 23 in one side shall be pressed to one of the end sides 13, 14 of the first concaved part 251, and the fixture 23 in the other side shall be pressed to the other end sides 13, 14 of the second concaved part 252.

The frame case 240 can be fixed in the X-direction and Y-direction also by holding the outer circumferential side surface of the frame case 240. That is, in order to fix the frame case 240 in the X-direction, the side surfaces 233, 234 of the frame case 240 can be supported by a fixture which is different from the fixture 23. In order to fix the frame case 240 in the Y-direction, the under surface 235 of the frame case 240, and an upper surface of the upper part 221 of the flange part 220 can be supported by a fixture which is different from the fixture 23.

The frame case 240 can be fixed in the Z-direction using the fixture 23 by moving the fixture 23 in the Z-direction and press the bottom surfaces 11 of the first and second concaved parts 251, 252 since the first and second concaved parts 251, 252 are opened in the front surface 231 side of the frame part 230. Thus, fixation of the frame case 240 can be done efficiently.

FIG. 11 is a diagram for illustrating a joining method of the frame case 240 and the metal base 210 in the side surface 233 side of the frame case 240. The discussion below will be the same for the side surface 234 side of the frame case 240.

Regarding the fixture 23 mounted on the bottom surface 11 of the first concaved part 251 of the frame case 240, the depth of the bottom surface 11 of the first concaved part 251 and the thickness of the fixture 23 are set such that the upper surface of the fixture 23 is lower than the front surface 231 of the frame part 230.

Under this state, the outer circumferential edge of the metal base 210 and the peripheral part of the opening part 261 of the frame case 240 are joined by friction stir welding, for example, using the joining tool 25. The friction stir welding is achieved by: arranging the edge surface of the joining tool 25 corresponding to a matching surface of the outer circumferential side surface of the metal base 210 and the opening part 261 of the frame case 240; and then moving the joining tool 25 along the matching surface around the entire circumferences of the opening part 261. The metal base 210 and the frame case 240 are thereby joined with the joining part FW.

As illustrated in FIG. 11, when it is projected from the thickness direction (Z-direction) of the frame case 240, the projection part $P_1$ of the first concaved part 251 is arranged outside the projection part $P_2$ of the joining part FW. That is, the length direction (X-direction) side end surface 12 of the first concaved part 251 is positioned outside the joining part FW. Therefore, a load occurring at the time of joining with the joining tool 25 can be supported by a portion between an inner surface 230a of the frame part 230 of the frame case 240 and the side end surface 12. This allows preventing deformation of the frame case 240 due to the load at the time of the joining.

When it is projected from the thickness direction (Z-direction) of the frame case 240, the projection part $P_1$ of the first concaved part 251 is arranged overlapping a side 233a of the side surface 233. That is, the bottom surface 11 of the first concaved part 251 is provided inside the region of the side surface 233 which is curved circularly, and is opened outside directly from the side surface 233. Thus, the first concaved part 251 is provided inside the region of the circularly curved side surface 233, and the bottom surface 11 of the first concaved part 251 is opened outside directly from the side surface 233. Therefore, compared with a structure where the first concaved part 251 is formed inside an outermost side 233a of the side surface 233, or with a structure where an isolation part such as side wall is provided between the first concaved part 251 and the outermost side 233a of the side surface 233, the frame case 240 can be made smaller.

FIG. 12 is an appearance perspective view illustrating a completion state of the case component 200 fabricated by the above mentioned method.

After the case component 200 is fabricated, the power semiconductor module 100 illustrated in FIG. 1 can be formed by: inserting the circuit unit 300 inside the case component 240 from the penetration hole 222 of the flange part 220; and accommodating the case component 200 inside the accommodation space of the case component 200 with each terminal projecting above the flange part 220. After the circuit unit 300 is accommodated to the case component 200, a resin can be injected in a crevice between the circuit unit 300 and the case component 200 and harden the resin.

The above mentioned embodiment has the following advantages.

(1) The first and second concaved parts 251, 252 are provided in the side surfaces 233, 234 of the frame case 240. The bottom surfaces 11 of the first and second concaved parts 251, 252 are pressed in the Z-direction using the fixture 23 and are fixed on the upper surface 24a of the fixture 24. Under this fixation state, the metal base 210 and the frame case 240 are joined. Therefore, the frame case 240 can be fixed certainly even when there is no space between the opening part 261 in the front surface 231 of the frame case 240 and the side surfaces 233, 234 for pressing the frame case 240 using the fixture 23. This allows reducing changes of position of the frame case 240 at the time of joining, and can increase an accuracy of the accommodation space of the circuit unit 300 formed in the case component 200. Therefore, the circuit unit 300 can be cooled satisfactorily using the case component 200 without expanding the size of the case component 200.

(2) When it is projected from the thickness direction (Z-direction) of the frame case 240, the first concaved part 251 is structured such that its projection part $P_1$ is arranged outside the projection part $P_2$ of the joining part FW (see FIG. 11). That is, the length direction (X-direction) side end surface 12 of the first concaved part 251 is positioned outside the joining part FW. The X-direction side end surface 12 of the first concaved part 251 is not positioned inside the joining part FW. Thus, the load due to the joining tool 25 can be supported by a portion of the frame part 230 between the inner surface 230a of the frame part 230 and the side end surface 12 of the first and second concaved parts 251, 252. Therefore, the deformation of the frame case 240 can be prevented.

(3) When it is projected from the thickness direction (Z-direction), the projection part $P_1$ of the first concaved part 251 is arranged overlapping the side 233a of the side surface 233 (see FIG. 11). Since the bottom surface 11 of the first concaved part 251 is provided inside the region of the circularly curved side surface 233, the frame case 240 can be made small. Further, the bottom surface 11 of the first concaved part 251 is structured opened outside directly from the side surface 233. This structure also allows making the frame case 240 small.

(4) The first and second concaved parts 251, 252 are opened towards the front surface 231 of the frame case 240. Therefore, the frame case 240 can be fixed by moving the fixture 23 in the Z-direction and pressing the bottom surfaces 11 of the first and second concaved parts 251, 252. This allows an efficient fixation of the frame case 240.

Second Embodiment

The second embodiment of the power semiconductor module of the present invention will be discussed with reference to FIG. 13 through FIG. 17.

Figure 13:
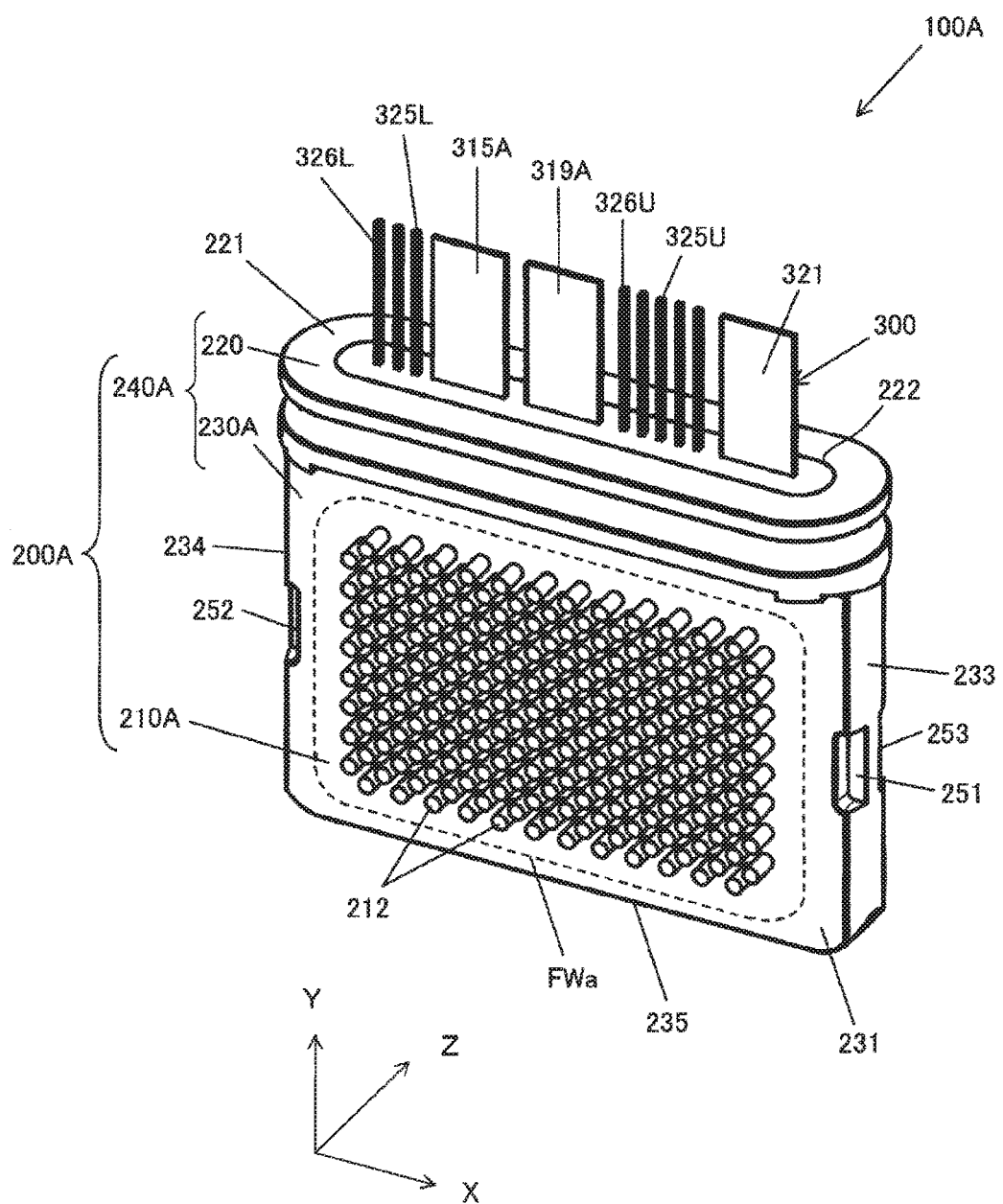
FIG. 13 is an appearance perspective view of a power semiconductor module according to a second embodiment of the present invention.
Figure 14:
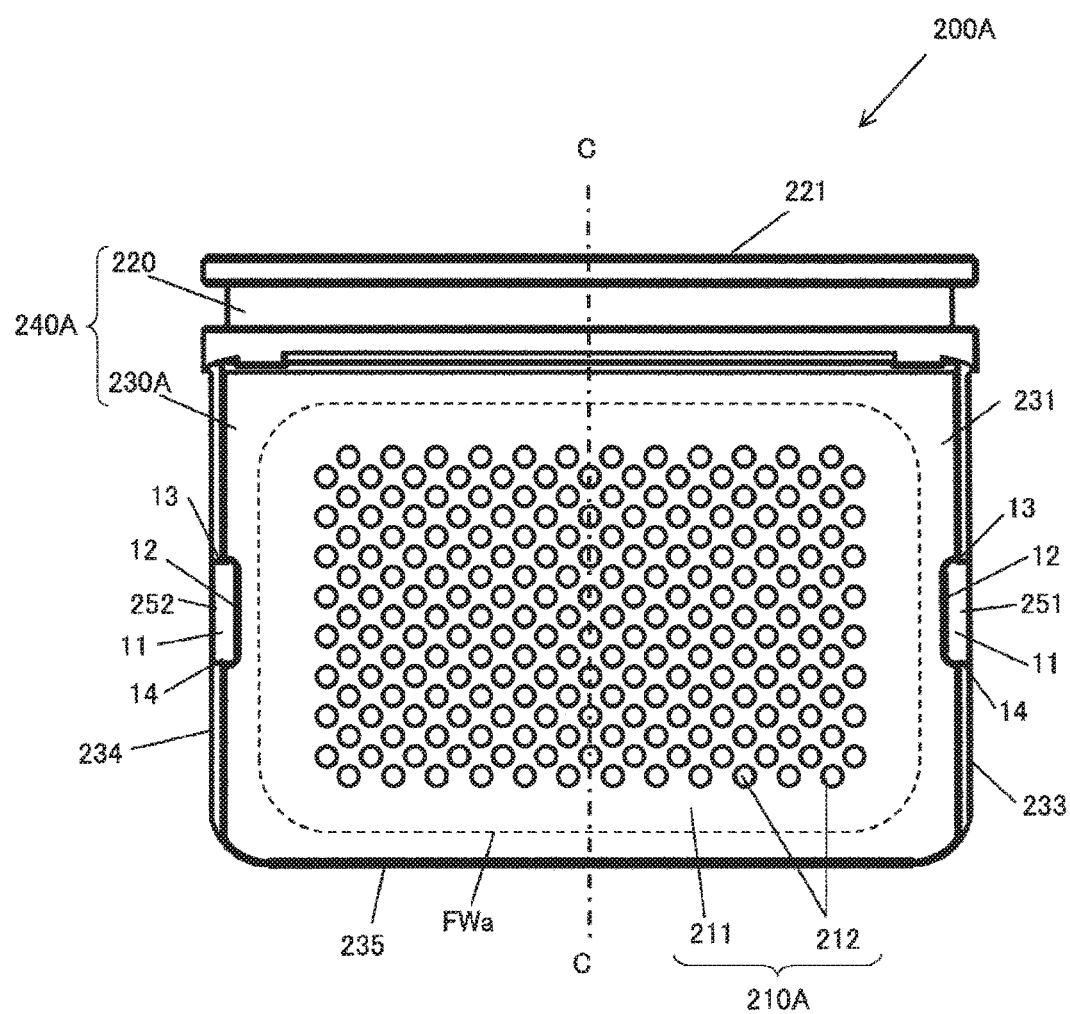
FIG. 14 is a front view of the case component of the power semiconductor module illustrated in FIG. 13.
Figure 14:
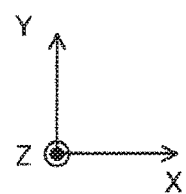

FIG. 13 is an appearance perspective view of the power semiconductor module according to the second embodiment of the present invention. FIGS. 14 through 17 are, respectively, front view, right side view, left side view, and rear side view of the case component of the power semiconductor module illustrated in FIG. 13.

A power semiconductor module 100A of the second embodiment differs from the power semiconductor module 100 of the first embodiment in that a case component 200A is structured joined to metal bases 210A, 210B in both front and rear sides. That is, the case component 200A is joined to the metal base 210A in a front surface 231 of the frame case 240A, and is joined to the metal base 210B in a back surface 232 of the frame case 240A.

Hereinafter, the second embodiment will be discussed focusing on the points different from the first embodiment. For configurations common to the first embodiment, same reference numbers will be given to the corresponding components, and the explanations thereof may be omitted.

The frame case 240A has opening parts 261 as illustrated in FIG. 8 in the both front surface 231 and back surface 232. Each of the metal bases 210A, 210B is inserted into respective opening parts 261 in the front surface 231 and the back surface 232 of the frame case 240A. Each of the peripheral parts of the metal bases 210A, 210B is joined to the peripheral part of the opening part 261 of the frame case 240A, respectively, in joining parts FWa, FWb. The metal bases 210A, 210B are the same components as the metal base 210 of the first embodiment, and each has the radiating fin 212.

The side surfaces 233, 234 are formed, respectively, with a first concaved part 251 and a second concaved part 252 in the front surface 231 side of the frame case 240A, similarly to the first embodiment. The first concaved part 251 and the second concaved part 252 are arranged symmetrically with a central axis C-C (see FIG. 14) of the length direction (X-direction) of the frame case 240A. The side surfaces 233, 234 are formed, respectively, with a third concaved part 253 and a fourth concaved part 254 in the back surface 232 side of the frame case 240A. The third concaved part 253 and the fourth concaved part 254 are arranged symmetrically with the central axis C-C (see FIG. 17) of the length direction (X-direction) of the frame case 240. All of the first concaved part 251 through the fourth concaved part 254 are formed with same length with respect to the height direction (Y-direction) and the length direction (X-direction), and are formed with same geometries.

Figure 15:
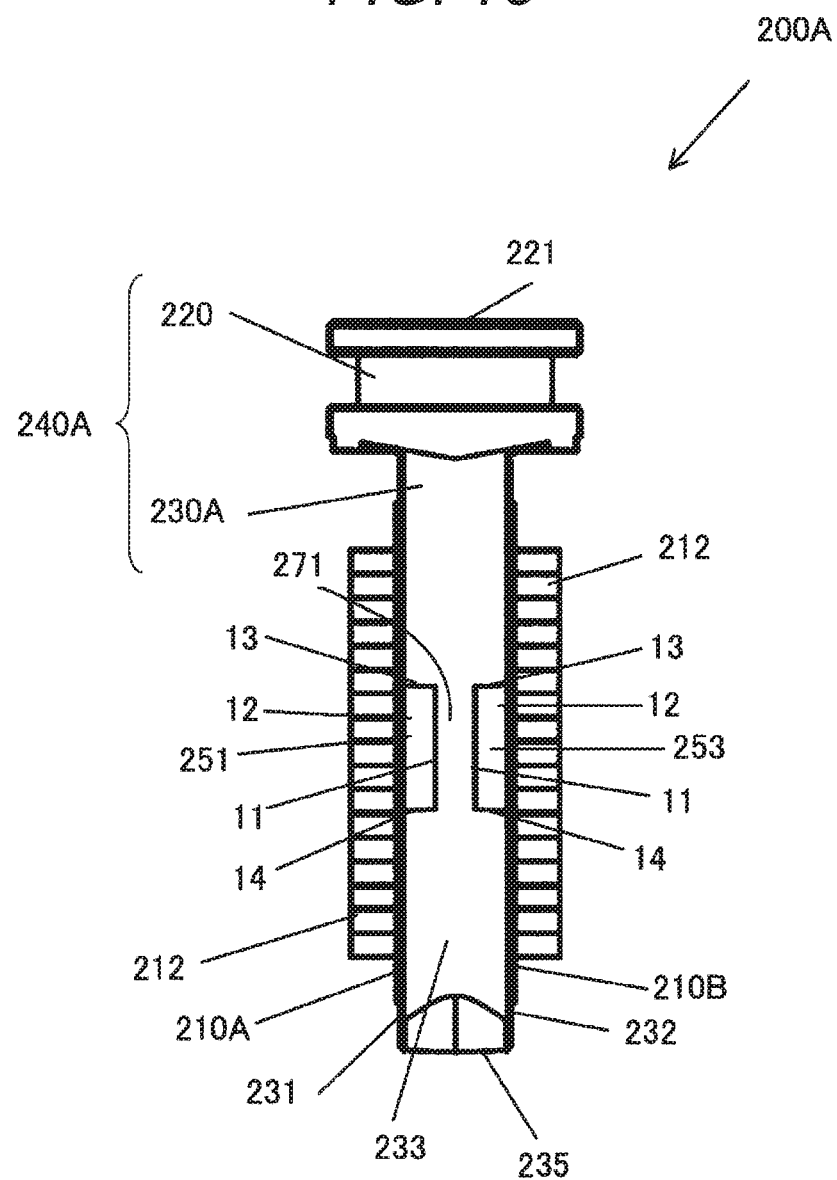
FIG. 15 is a right side view of the case component of the power semiconductor module illustrated in FIG. 13.
Figure 16:
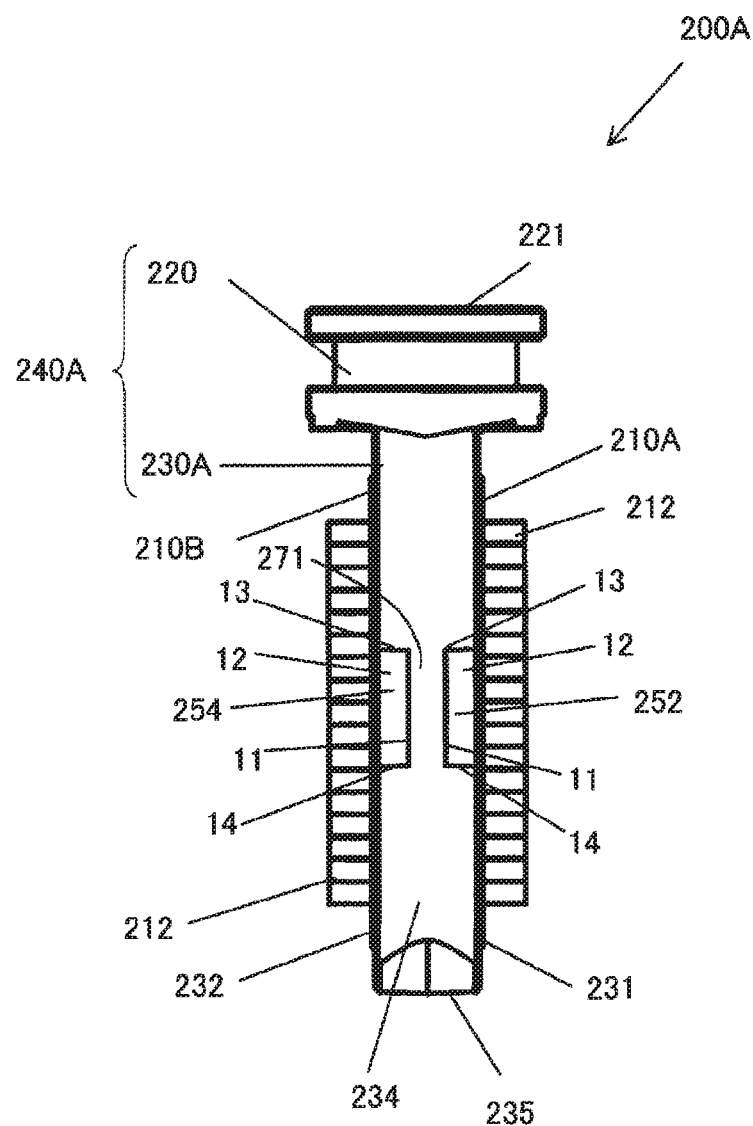
FIG. 16 is a left side view of the case component of the power semiconductor module illustrated in FIG. 13.
Figure 17:
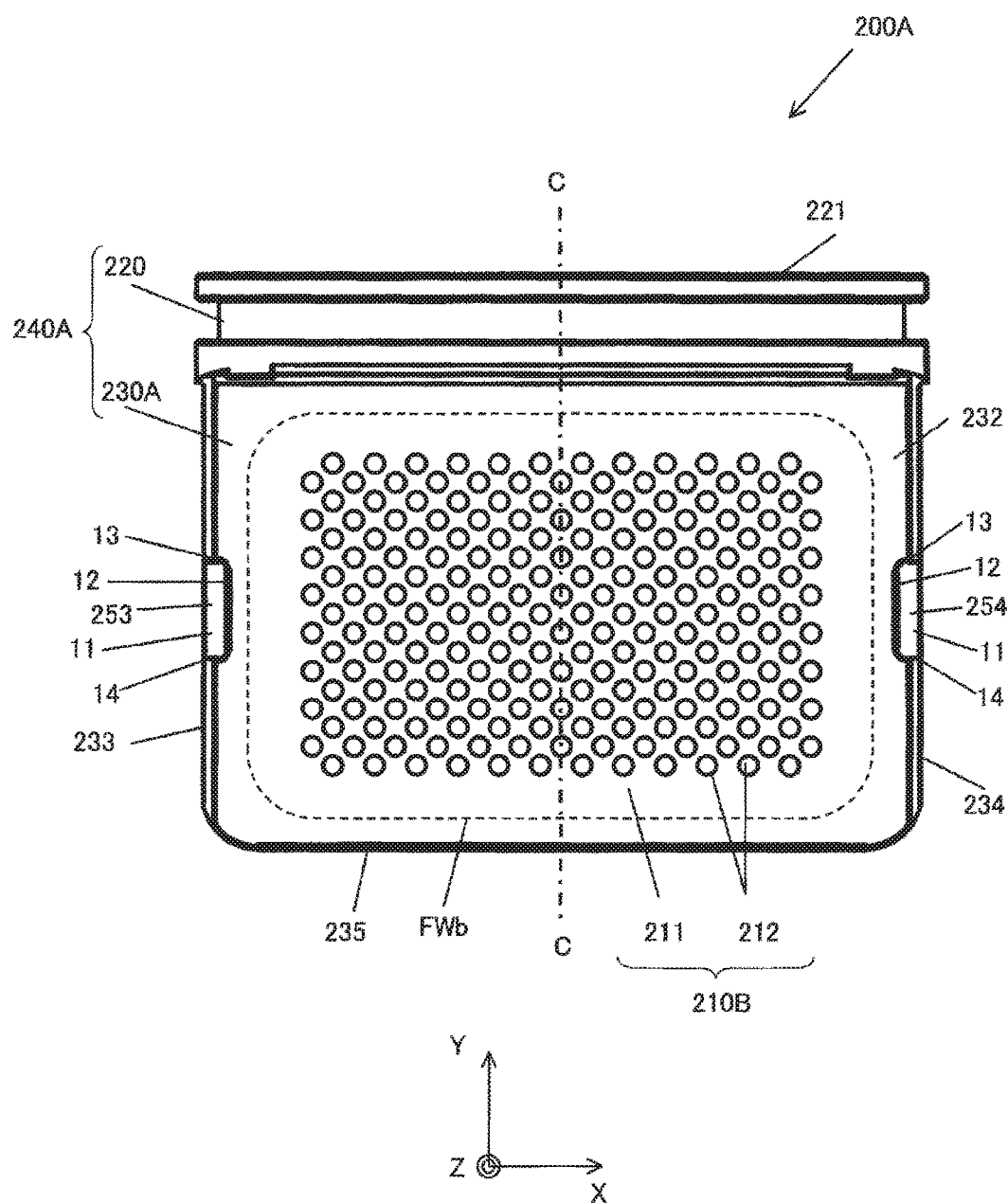
FIG. 17 is a rear side view of the case component of the power semiconductor module illustrated in FIG. 13.

The bottom surfaces 11 of the first and second concaved parts 251, 252 are arranged in the front surface 231 side compared to the center part of the frame case 240A in the thickness direction (Z-direction). The bottom surfaces 11 of the third and fourth concaved parts 253, 254 are arranged in the back surface 232 side compared to the center part of the thickness direction (Z-direction) of the frame case 240A. Therefore, as illustrated in FIG. 15, the bottom surface 11 of the first concaved part 251 and the bottom surface 11 of the third concaved part 253 are arranged facing each other in the same positions with respect to the height direction (Y-direction) on the side surface 233 of the frame case 240A. However, the bottom surface 11 of the first concaved part 251 is separated from the bottom surface 11 of the third concaved part 253. That is, the first concaved part 251 and the third concaved part 253 are arranged with a partition part 271 intervened therebetween. Similarly, as illustrated in FIG. 16, the bottom surface 11 of the second concaved part 252 is separated from the bottom surface 11 of the fourth concaved part 254. That is, the second concaved part 252 and the fourth concaved part 254 are arranged with the partition part 271 intervened therebetween.

In order to fabricate the case component 200A of the power semiconductor module 100A of the second embodiment, the metal base 210A is inserted into the opening part 261 of the front surface 231 of the frame case 240A using the method discussed in the first embodiment, and then is joined by friction stir welding using the joining tool 25. Thus, the joining part FWa is formed in the peripheral part of the opening part 261 of the front 231 of the frame case 240A and the peripheral part of the metal base 210A.

Next, the fixture 23 is raised in the thickness direction (Z-direction), then the frame case 240A is rotated 180 degrees centering the central axis C-C, and the frame case 240A joined with the metal base 210A is supported by the receiving fixture 24. Then the fixture 23 is descended, the bottom surfaces 11 of the third and fourth concaved parts 253, 254 formed in the side surfaces 233, 234 of the frame case 240A are pressed to the receiving fixture 24 side, and the bottom surfaces 11 is fixed.

As discussed above, the first and second concaved parts 251, 252 are formed in the front surface 231 side symmetrically with the central axis C-C. The third and fourth concaved parts 253, 254 are formed in the back surface 232 side symmetrically with the central axis C-C.

Therefore, when the frame case 240A is flipped centering the central axis C-C, the third and fourth concaved parts 253, 254 are arranged in the positions same as the first and second concaved parts 251, 252 before being flipped. Thus, the bottom surfaces 11 of the third and fourth concaved parts can be pressed only by descending the fixture 23 in the thickness direction (Z-direction), and does not need performing a position matching with the third and fourth concaved parts 253, 254. This allows an efficient fixation of the frame case 240A.

Thereafter, the metal base 210B is inserted into the opening part 261 of the back surface 232 of the frame case 240A. Then the metal base 210B and the frame case 240A are joined by friction stir welding using the joining tool 25. The joining part FWb is thereby formed in the peripheral part of the opening part 261 of the back surface 232 of the frame case 240A and the peripheral part of the metal base 210B.

The positional relation of the side end surfaces 12 of the third and fourth concaved parts 253, 254 and the joining part FWb with respect to the X-direction is same as the positional relation of the side end surfaces 12 of the first and second concaved parts 251, 252 and the joining part FWa with respect to the X-direction.

That is, when it is projected from the thickness direction (Z-direction) of the frame case 240A, the projection parts $P_1$ of the first and second concaved parts 251, 252 are arranged outside the projection part of the joining part FWa. Further, the projection parts $P_1$ of the first and second concaved parts 251, 252 are arranged overlapping the projection parts $P_3$ of sides 233a, 234a (not illustrated) of the side surfaces 233, 234.

Similarly, when it is projected from the thickness direction (Z-direction) of the frame case 240A, the projection parts of the third and fourth concaved parts 253, 254 are arranged outside the projection part of the joining part FWb. Further, the projection parts of the third and fourth concaved parts 253, 254 are arranged overlapping the projection parts of sides 233a, 234a (not illustrated) of the side surfaces 233, 234.

In the second embodiment, the first and second concaved parts 251, 252 or the third and fourth concaved parts 253, 254 are provided in the side surfaces 233, 234, respectively, in the front surface 231 side or the back surface 232 side of the frame case 240A. Then the bottom surfaces 11 of the first concaved part 251 through the fourth concaved part 254 are pressed in the thickness direction (Z-direction) using the fixture 23 to fix the bottom surfaces 11. In this fixation state, the frame case 240A and the metal base 210A, or the frame case 240A and the metal base 210B, are joined respectively. This affords the similar advantages (1) through (4) which are discussed in the first embodiment.

In addition, the second embodiment has the following advantages.

(5) It is structured such that the metal bases 210A, 210B are joined to both front and back surfaces of the frame case 240A. That is, the opening part 261 of the frame case 240A penetrates the front and back surfaces. Thus, the back surface 232 does not have to be formed with a thin board region of large area. Therefore, a casting fabrication becomes easier and can increase productivity and yield.

(6) The first and second concaved parts 251, 252 and the third and fourth concaved parts 253, 254 are arranged symmetrically with the central axis C-C of the length direction (X-direction), respectively, in the front surface 231 side and the back surface 232 side of the frame case 240A. Therefore, when the frame case 240A is flipped centering the central axis C-C, the third and fourth concaved parts 253, 254 are arranged in the same positions with the first and second concaved parts 251, 252 before being flipped. Thus, the frame case 240A can be fixed by the fixture 23 without performing a position matching with the third and fourth concaved parts 253, 254. This allows an efficient fixation of the frame case 240A.

Third Embodiment

The third embodiment of a power semiconductor module of the present invention will be discussed with reference to FIG. 18 through FIG. 28.

Figure 18:
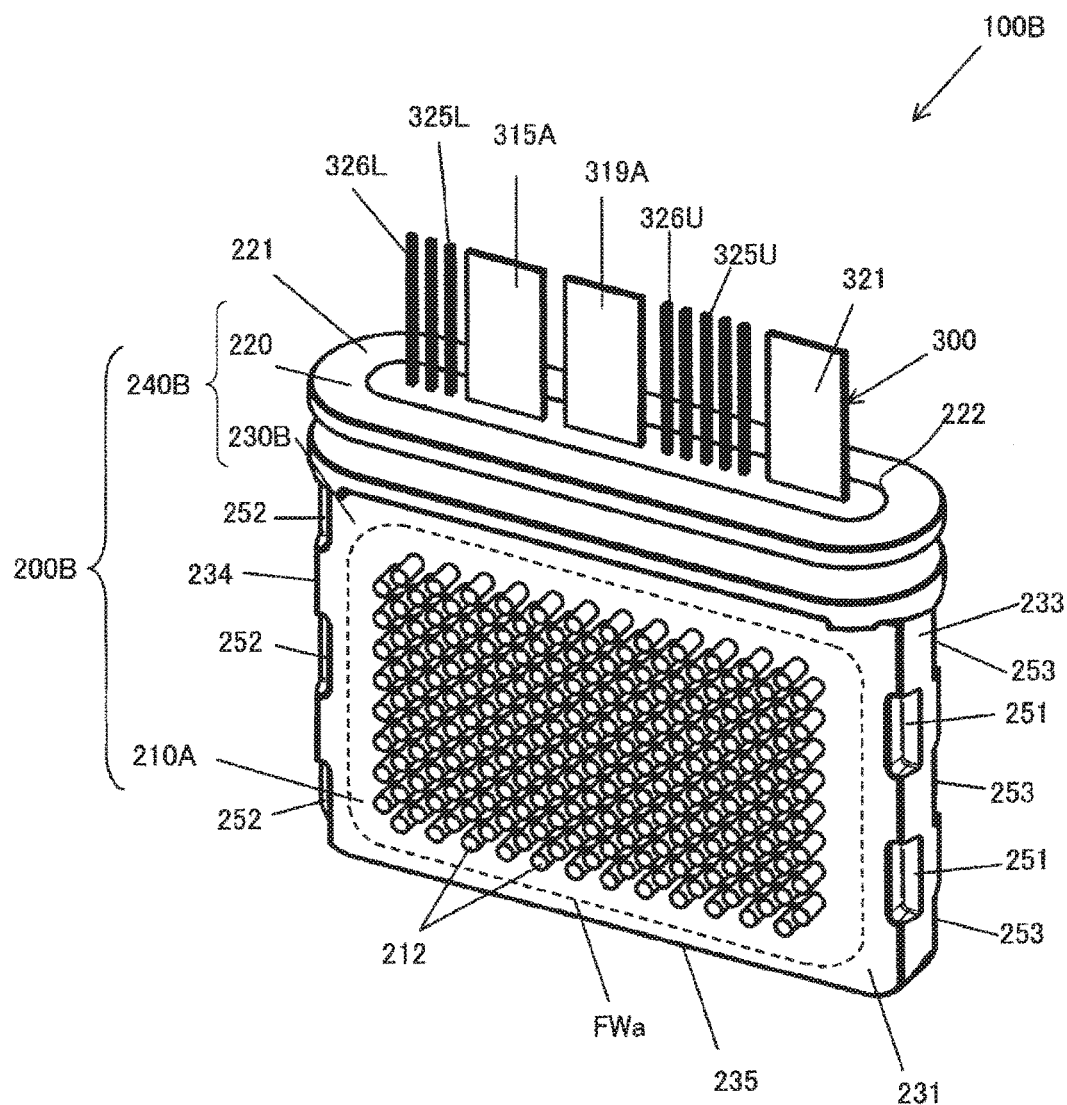
FIG. 18 is an appearance perspective view of a power semiconductor module according to a third embodiment of the present invention.
Figure 19:
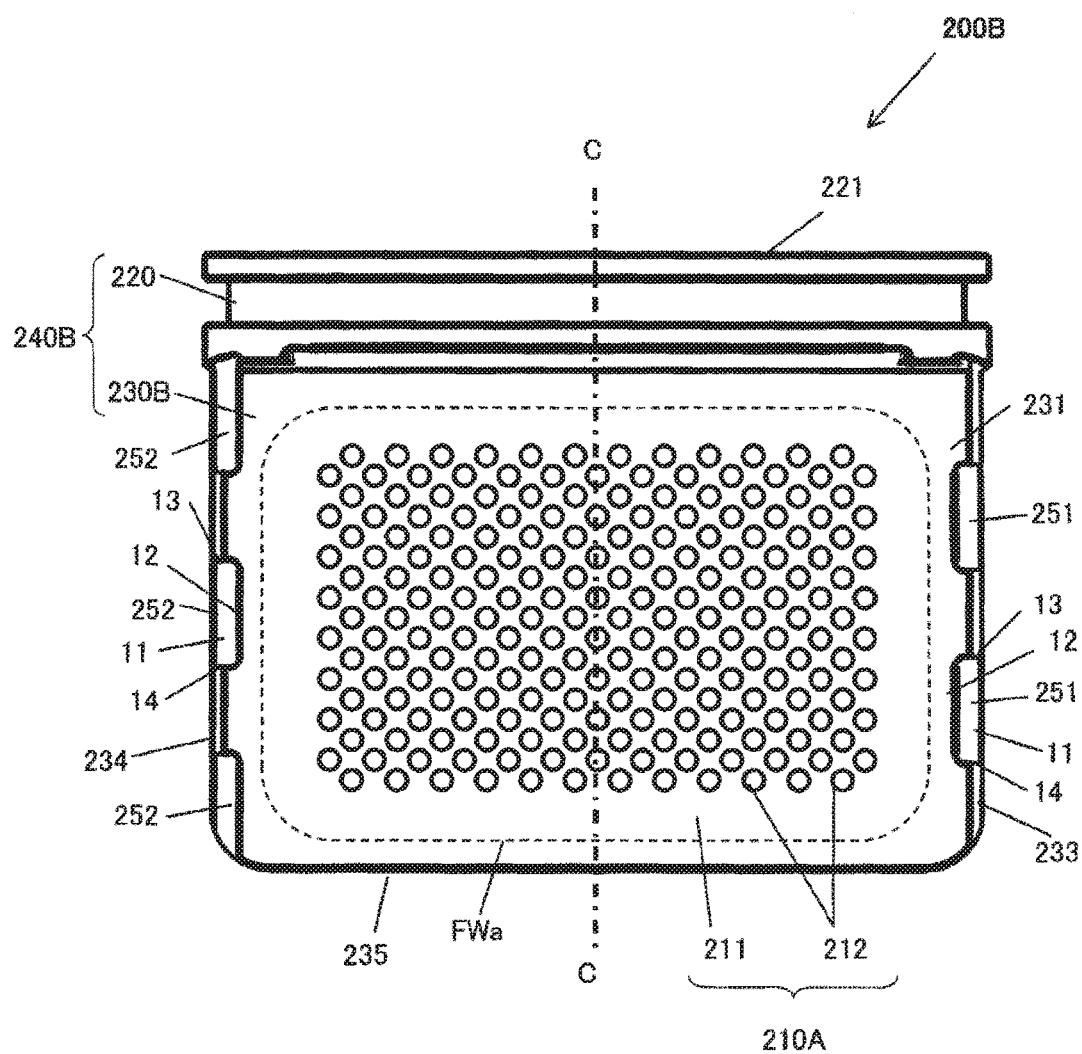
FIG. 19 is a front view of the case component of the power semiconductor module illustrated in FIG. 18.
Figure 23:
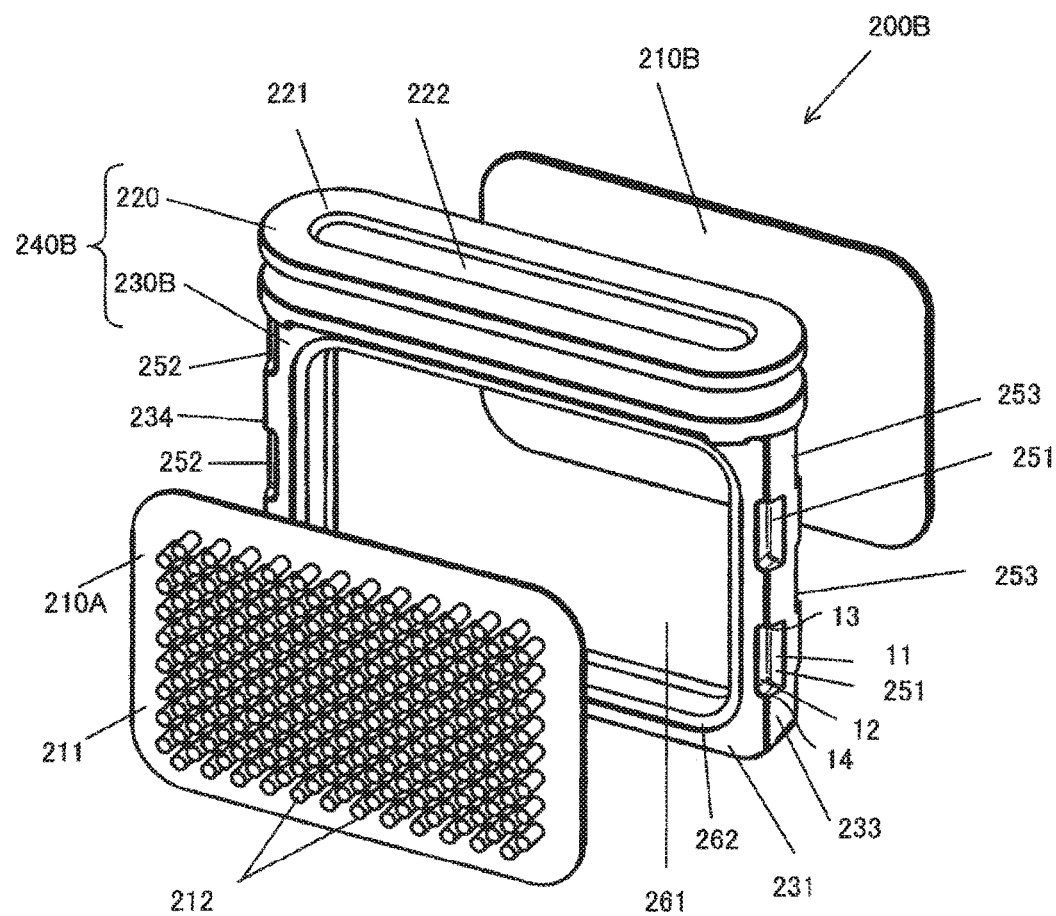
FIG. 23 is an exploded perspective view of the case component of the power semiconductor module illustrated in FIG. 18.

FIG. 18 is an appearance perspective view of the power semiconductor module according to the third embodiment of the present invention. FIG. 19 through FIG. 22 are, respectively, front view, right side view, left side view, and rear side view of the case component of the power semiconductor module illustrated in FIG. 18. FIG. 23 is an exploded perspective view of the case component illustrated in FIG. 18.

The third embodiment differs from the second embodiment in that each of the first through fourth concaved parts is formed in multiple. Hereinafter, the third embodiment will be discussed focusing on the points different from the second embodiment. For configurations common to the second embodiment, same reference numbers will be given to the corresponding components, and explanations thereof may be omitted.

A power semiconductor module 100B of the third embodiment is structured such that a case component 200B is joined to the metal bases 210A, 210B in both front and back surfaces, similarly to the power semiconductor module 100A of the second embodiment.

The frame case 240B includes joining parts FWa, FWb that join, respectively, with the metal bases 210A, 210B in the front surface 231 and the back surface 232.

In contrast to the second embodiment, multiple first concaved parts 251 are formed in the front surface 231 side of the side surface 233 of the frame case 240B. Multiple second concaved parts 252 are formed in the front surface 231 side of the side surface 234. The number of the first concaved parts 251 formed in the side surface 233 differs from the number of the second concaved parts 252. In the side surface 233, even number of the first concaved parts 251 are formed (in this example, two). In the side surface 234, odd number of the second concaved parts 252 are formed (in this example, three).

In the back surface 232 side of the frame case 240B, multiple third concaved parts 253 are formed in the side surface 233, and multiple fourth concaved parts 254 are formed in the side surface 234. The number of the first concaved parts 251 formed in the front surface 231 side of the side surface 233 is same as the number of the fourth concaved parts 254 formed in the back surface 232 side of the side surface 234. The number of the second concaved parts 252 formed in the front surface 231 side of the surface side 234 is same as the number of the third concaved parts 253 formed in the back surface 232 side of the side surface 234.

That is, the first concaved part 251 and the fourth concaved part 254 are formed symmetrically with the central axis C-C of the length direction (X-direction) of the frame case 240. Similarly, the second concaved part 252 and the third concaved part 253 are formed symmetrically with the central axis C-C of the length direction (X-direction) of the frame case 240. All of the first concaved part 251 through the fourth concaved part 254 have the same length in the height direction (Y-direction) and in the length direction (X-direction), and are formed in same geometries. Therefore, when the frame case 240B is rotated 180 degrees centering the central axis C-C, the position and geometry of each fourth concaved part 254 matches with the position and geometry of each first concaved part 251 before being rotated, and the position and geometry of each third concaved part 253 matches with the position and geometry of the second concaved part 252 before being rotated.

Figure 20:
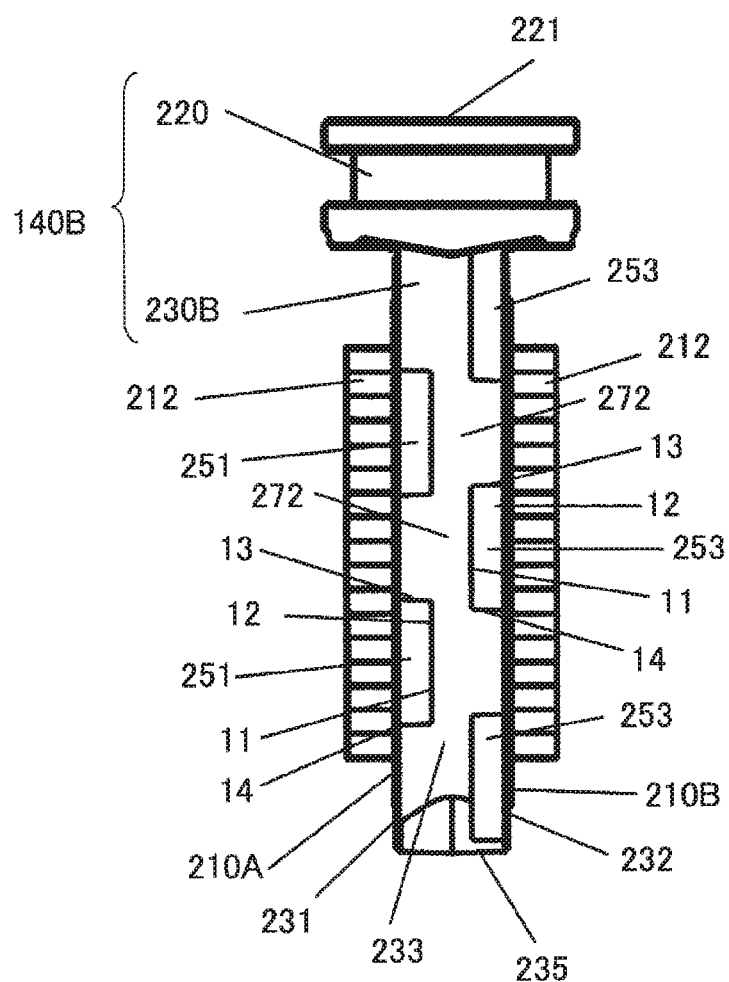
FIG. 20 is a right side view of the case component of the power semiconductor module illustrated in FIG. 18.

As illustrated in FIG. 20, each first concaved part 251 and each third concaved part 253 are formed in positions shifted in the height direction (Y-direction) of the side surface 233. The center of each first concaved part 251 in the height direction (Y-direction) is positioned substantially in the center between the third concaved parts 253. The upper and lower edge parts of each first concaved part 251 are arranged in positions overlapping one edge and the other edge of the third concaved parts 253 in the up and down.

Figure 21:
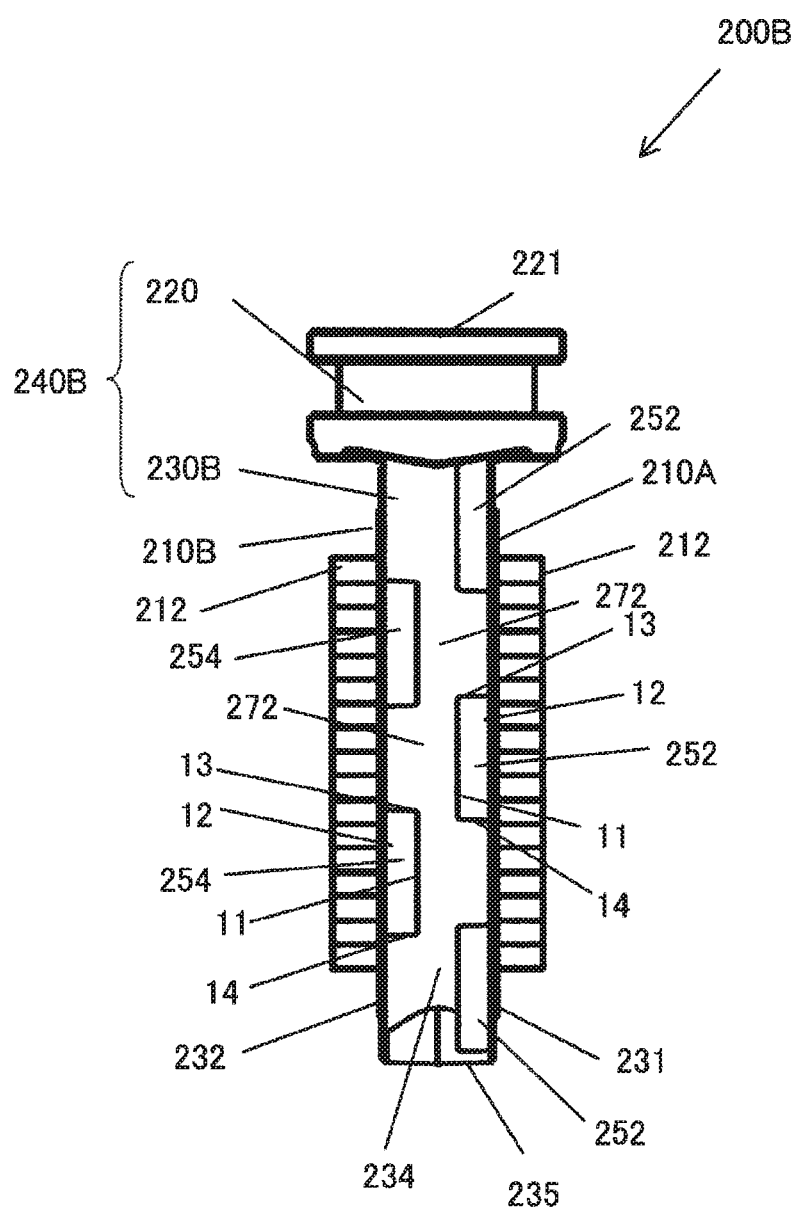
FIG. 21 is a left side view of the case component of the power semiconductor module illustrated in FIG. 18.
Figure 22:
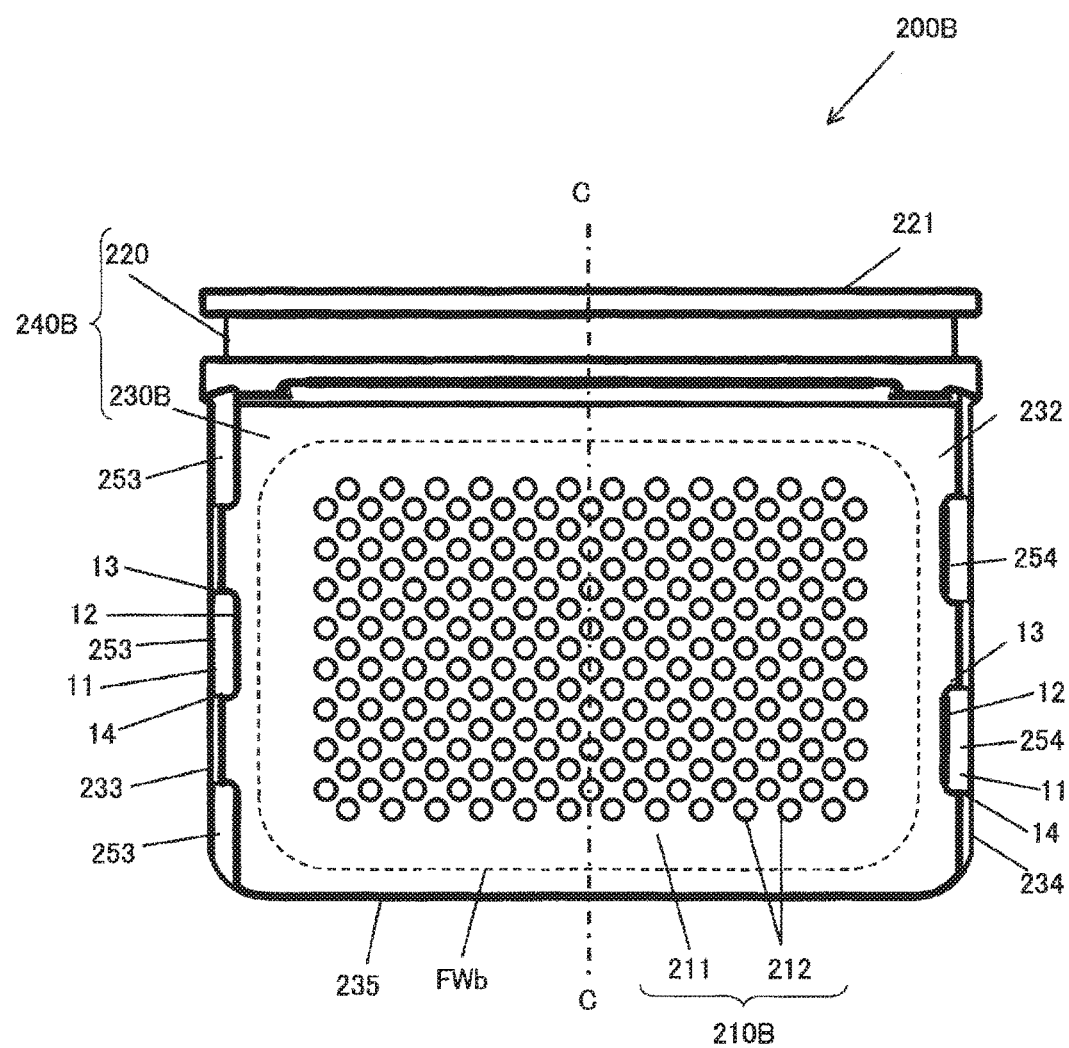
FIG. 22 is a rear side view of the case component of the power semiconductor module illustrated in FIG. 18.

As illustrated in FIG. 21, each second concaved part 252 and each fourth concaved part 254 are formed in positions shifted in the height direction (Y-direction) of the side surface 234. The center of each second concaved part 252 in the height direction (Y-direction) is positioned substantially in the center between the fourth concaved parts 254. The upper and lower edge parts of each second concaved part 252 are arranged in positions overlapping one edge and the other edge of the fourth concaved parts 254 in the up and down.

The bottom surfaces 11 of the first and second concaved parts 251, 252 are arranged in the front surface 231 side compared to the center part of the frame case 240B in the thickness direction (Z-direction). The bottom surfaces 11 of the third and fourth concaved parts 253, 254 are arranged in the back surface 232 side compared to the center part of the frame case 240B in the thickness direction (Z-direction). Therefore, as illustrated in FIG. 20 and FIG. 21, each bottom surface 11 of the first concaved part 251 and the third concaved part 253, and each bottom surface 11 of the second concaved part 252 and the fourth concaved part 254 are arranged on the both sides of the partition part 272 facing each other. Since the central region of the partition part 272 is not formed with one of the first and second concaved parts 251, 252 or one of the third and fourth concaved parts 253, 254, rigidity of the partition part 272 becomes larger than that of the partition part 271 of the second embodiment which is formed in a region where entire first and second concaved parts 251, 252 or entire third and fourth concaved parts 253, 254 are facing each other.

The manufacturing method of the power semiconductor module 100B of the third embodiment will be discussed.

Figure 24:
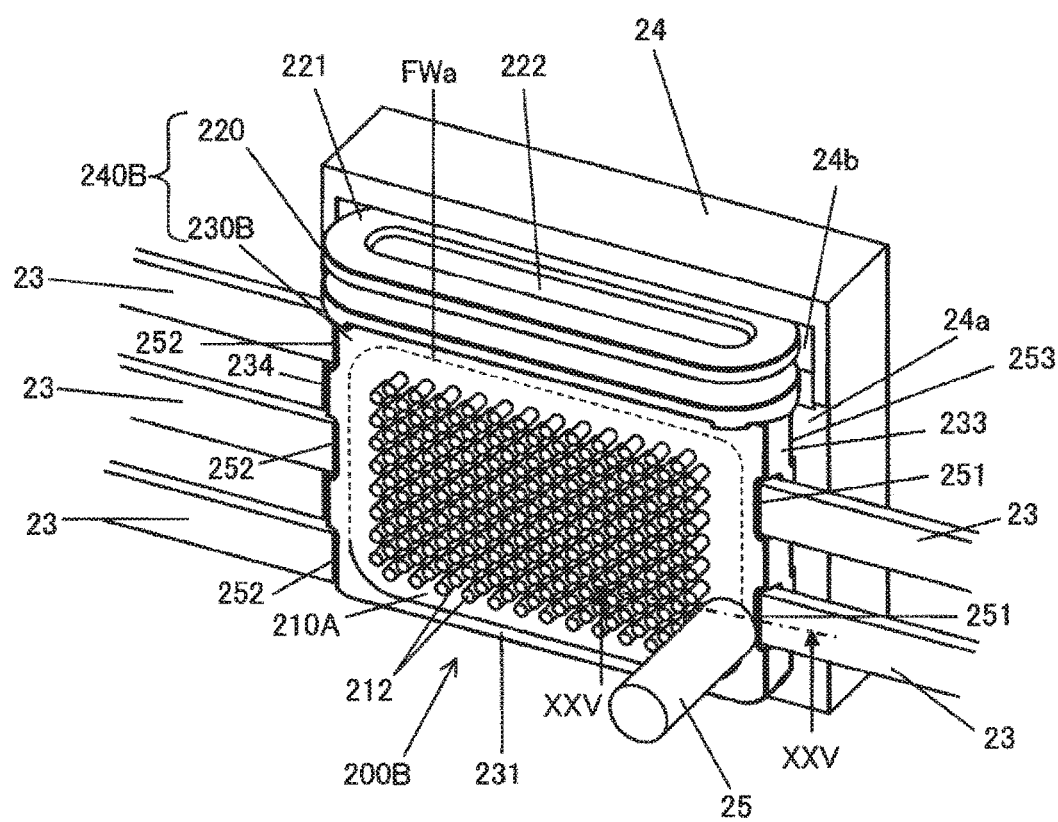
FIG. 24 is a perspective view for illustrating a manufacturing method of the case component illustrated in FIG. 18.
Figure 25:
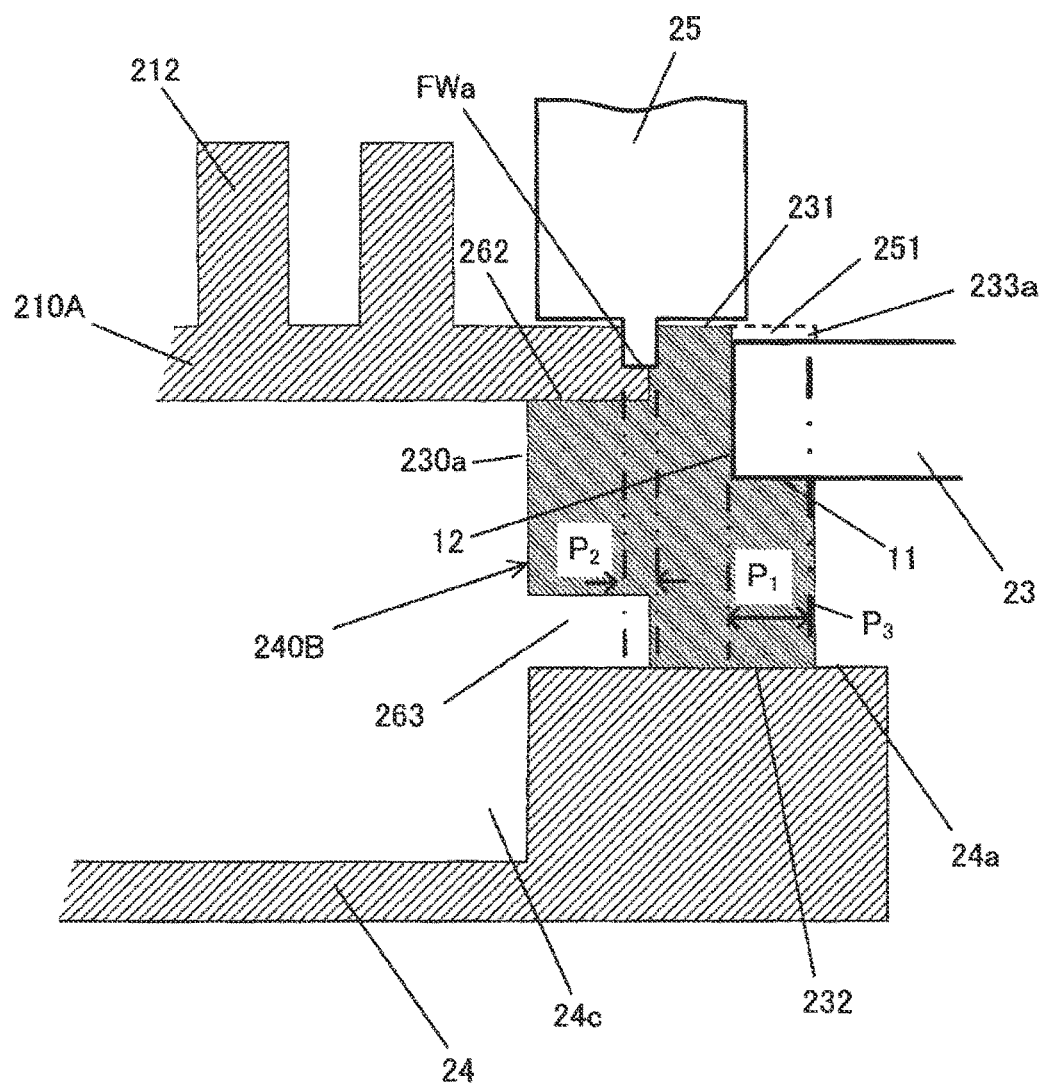
FIG. 25 is a sectional view on the XXV-XXV line of FIG. 24.
Figure 26:
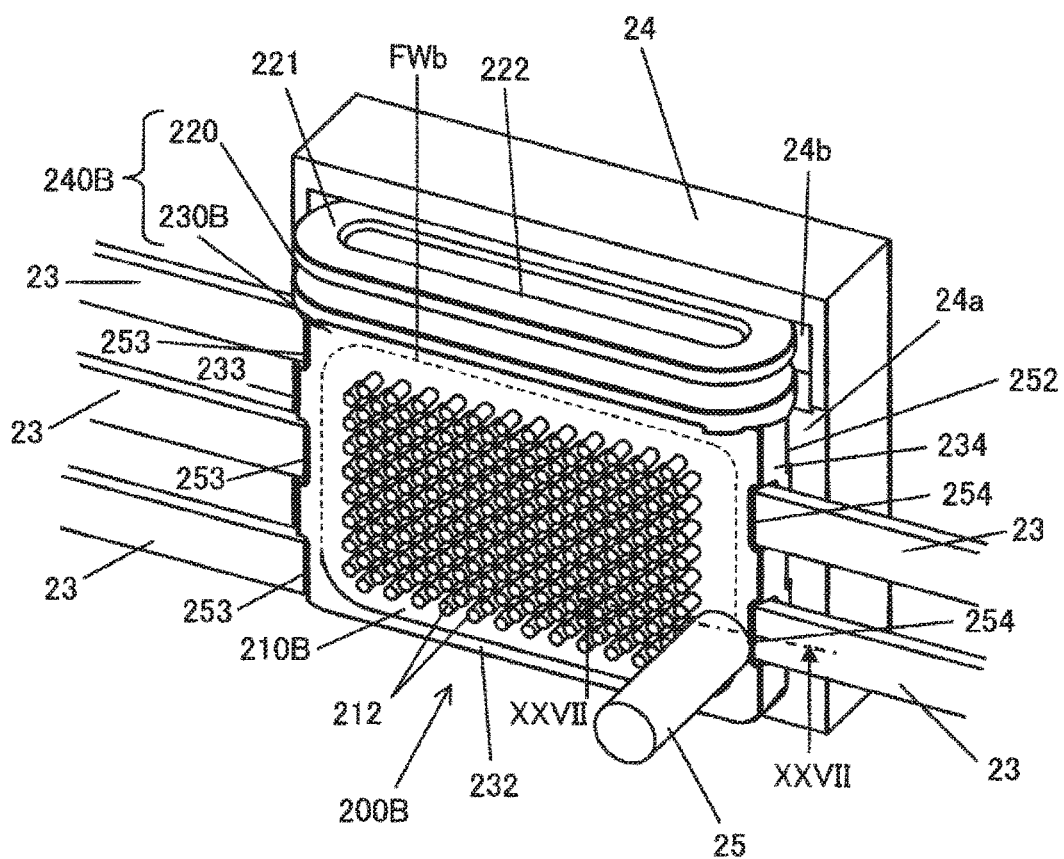
FIG. 26 is a perspective view for illustrating a process succeeding FIG. 24.
Figure 27:
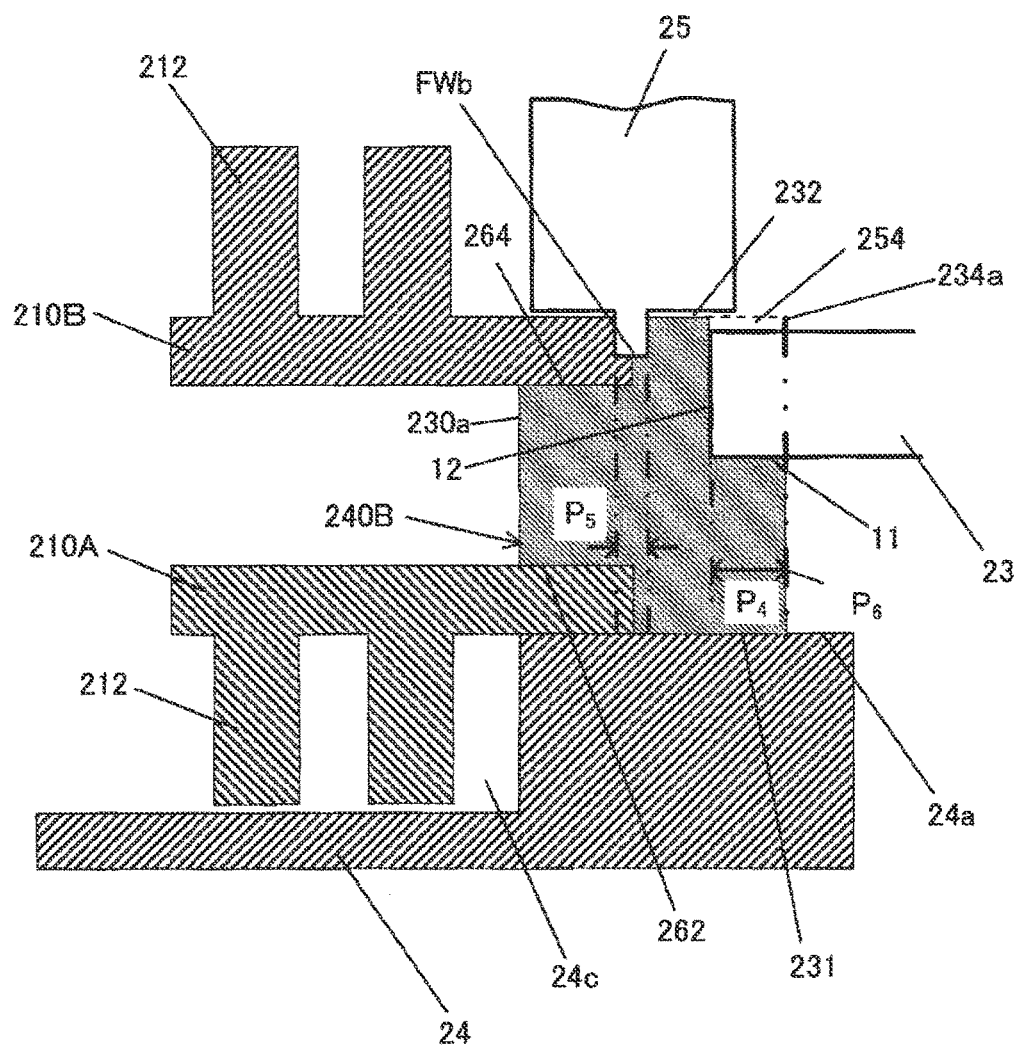
FIG. 27 is a sectional view on the XXVII-XXVII line of FIG. 26.
Figure 28:
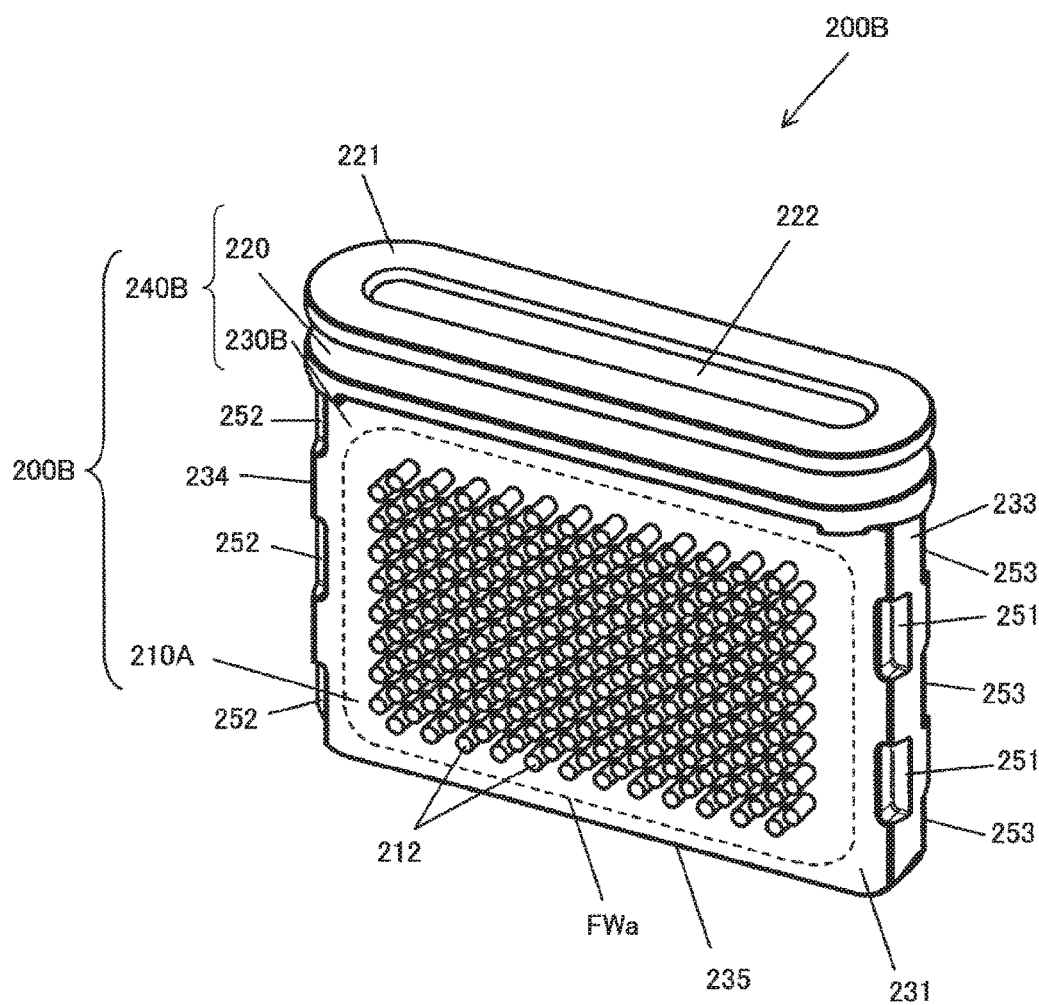
FIG. 28 is an appearance perspective view illustrating a completion state of the case component fabricated by a manufacturing method illustrated in FIG. 24 through FIG. 27.

FIG. 24 is a perspective view for illustrating a manufacturing method of the case component illustrated in FIG. 18. FIG. 25 is a sectional view on the XXV-XXV line of FIG. 24. FIG. 26 is a perspective view for illustrating a process succeeding FIG. 24. FIG. 27 is a sectional view on the XXVII-XXVII line of FIG. 26. FIG. 28 is an appearance perspective view illustrating the case component of the power semiconductor module according to the third embodiment of the present invention.

As discussed in the second embodiment, the frame case 240B is supported with the receiving fixture 24.

First, the metal base 210A is inserted into the opening part 261 of the front surface 231 of the frame case 240B, and is installed on the step part 262 (see FIG. 8) formed in the peripheral part of the opening part 261 of the frame case 240B.

As illustrated in FIG. 24, the bottom surface 11 of each first concaved part 251 and the bottom surface 11 of each second concaved part 252 are pressed by fixtures 23 for fixing the frame case 240B. Two of the fixtures 23 press the bottom surfaces 11 of the first concaved parts 251 formed in the front surface 231 side, and three of the fixtures 23 press the bottom surfaces 11 of the second concaved parts 252. The metal base 210A and the front surface 231 of the frame case 240B are joined by friction stir welding. The joining part FWb is thereby formed in the peripheral part of the opening part 261 of the front surface 231 of the frame case 240B and the peripheral part of the metal base 210A.

FIG. 25 illustrates a sectional view on the XXV-XXV line of FIG. 24. in the joining state.

This state is similar to that of the first embodiment, except that the opening part 263 is formed in the back surface 232 of the frame case 240B. That is, when it is projected from the thickness direction (Z-direction) of the frame case 240B, the projection part $P_1$ of each first concaved part 251 is arranged outside the projection part $P_2$ of the joining part FWa. The projection part $P_1$ of each first concaved part 251 is arranged overlapping the side 233$a$ of the side surface 233.

When the joining of the metal base 210A and the front surface 231 of the frame case 240B is completed, all of the fixtures 23 are raised in the thickness direction (Z-direction). Then the frame case 240B joined with the metal base 210A is flipped centering the central axis C-C, and the front surface 231 side of the frame case 240B is supported by the receiving fixture 24.

As discussed above, when the frame case 240B is rotated 180 degrees centering the central axis C-C, the position and geometry of each fourth concaved part 254 match with the position and geometry of each first concaved part 251 before being rotated. Further, the position and geometry of each third concaved part 253 match with the position and geometry of the second concaved part 252 before being rotated. That is, as illustrated in FIG. 26, the positions and geometries of two fourth concaved parts 254 and three third concaved parts 253 provided in the back surface 232 side match with those of two first concaved parts 251 and three second concaved parts 252 before the frame case 240B is being flipped. Thus, each bottom surface 11 of the fourth concaved part 254 and the third concaved part 253 can be pressed and fixed to the receiving fixture 24 side only by descending five fixtures 23 in the thickness direction (Z-direction) which are raised above.

The metal base 210B is inserted into the opening part 263 of the back surface 232 side of the frame case 240B, and is installed on a step part 264 (see FIG. 27) formed in the peripheral part of the opening part 263 of the frame case 240B. Then the metal base 210B and the frame case 240B are joined by friction stir welding using the joining tool 25. Thus, the joining part FWb is formed in the peripheral part of the opening part 263 in the back surface 232 side of the frame case 240B and the peripheral part of the metal base 210B.

Therefore, similarly to the second embodiment, the bottom surfaces 11 of the third and fourth concaved parts 253, 254 can be pressed only by descending the fixture 23 in the Z-direction according to the third embodiment. There is no need to perform a position matching with the third and fourth concaved parts 253, 254. Thus, fixation of the frame case 240B can be done efficiently.

FIG. 27 indicates a sectional view on the XXVII-XXVII line of FIG. 26 in the joining state.

In this state, the positional relation of the fourth concaved part 254 and the joining part FWb is similar to the positional relation of the first concaved part 251 and the joining part FWa. That is, when it is projected from the thickness direction (Z-direction), the projection part $P_4$ of each fourth concaved part 254 is arranged outside the projection part $P_5$ of the joint part FWb. The projection part $P_4$ of each fourth concaved part 254 is arranged overlapping the projection part $P_6$ of the side 234a of the side surface 234. The length of the projection parts $P_4$ of the fourth concaved parts 253, 254 can be the same as the length of the projection part $P_1$ of the first concaved part 251. Or otherwise, the length can be different. The essential point is that, the projection part $P_4$ of each fourth concaved part 254 shall be arranged outside the projection part $P_5$ of the joining part FWb.

The third embodiment differs from the second embodiment only in that the number of the first concaved part 251 through the fourth concaved part 254 are multiple. Therefore, the third embodiment also has the advantages (1) through (5) of the second embodiment.

Further, in the third embodiment, the partition part 272 has a thick region where the first concaved part 251 and the third concaved part 253 do not face each other or a thick region where the second concaved part 252 and the fourth concaved part 254 do not face each other. Thus, the partition part 272 has large rigidity compared to the partition part 271 of the second embodiment. Therefore, deformation of the frame case 240B at the time of joining can be made smaller compared to the second embodiment. This allows improving dimension accuracy of the accommodation space formed inside the case component 200B.

The above mentioned third embodiment exemplifies a structure where the numbers of the first and third concaved parts 251, 253 are different, and the numbers of the second and fourth concaved parts 252, 254 are different. However, the numbers of the first concaved part 251 and the third concaved part 253 can be the same, or the numbers of the second concaved part 252 and the fourth concaved part 254 can be the same. However, it is desirable to increase rigidity of the partition part by shifting the positions of the first and third concaved parts 251, 253 formed in the side surface 233 side with the positions of the second and fourth concaved parts 252, 254 formed in the side surface 234 side. Also, it is desirable to arrange the first and third concaved parts 251, 253 and the second and fourth concaved parts 252, 254 symmetrically with the central axis C-C of the length direction (X-direction). When the numbers of the first concaved part 251 through the fourth concaved part 254 are each two (not illustrated), for example, the first and fourth concaved parts 251, 254 can be arranged in the central side of the frame part 230B in the height direction (Y-direction), and the second and third concaved parts 252, 253 can be arranged outside the first and fourth concaved parts 251, 254 with respect to the height direction (Y-direction). The first concaved part 251 and the third concaved part 253 can be arranged not overlapping each other with respect to the height direction (Y-direction). The second concaved part 252 and the fourth concaved part 254 can be arranged not overlapping each other with respect to the height direction. The numbers of the first concaved part 251 through the fourth concaved part 254 are each not restricted to two.

Fourth Embodiment

Figure 29:
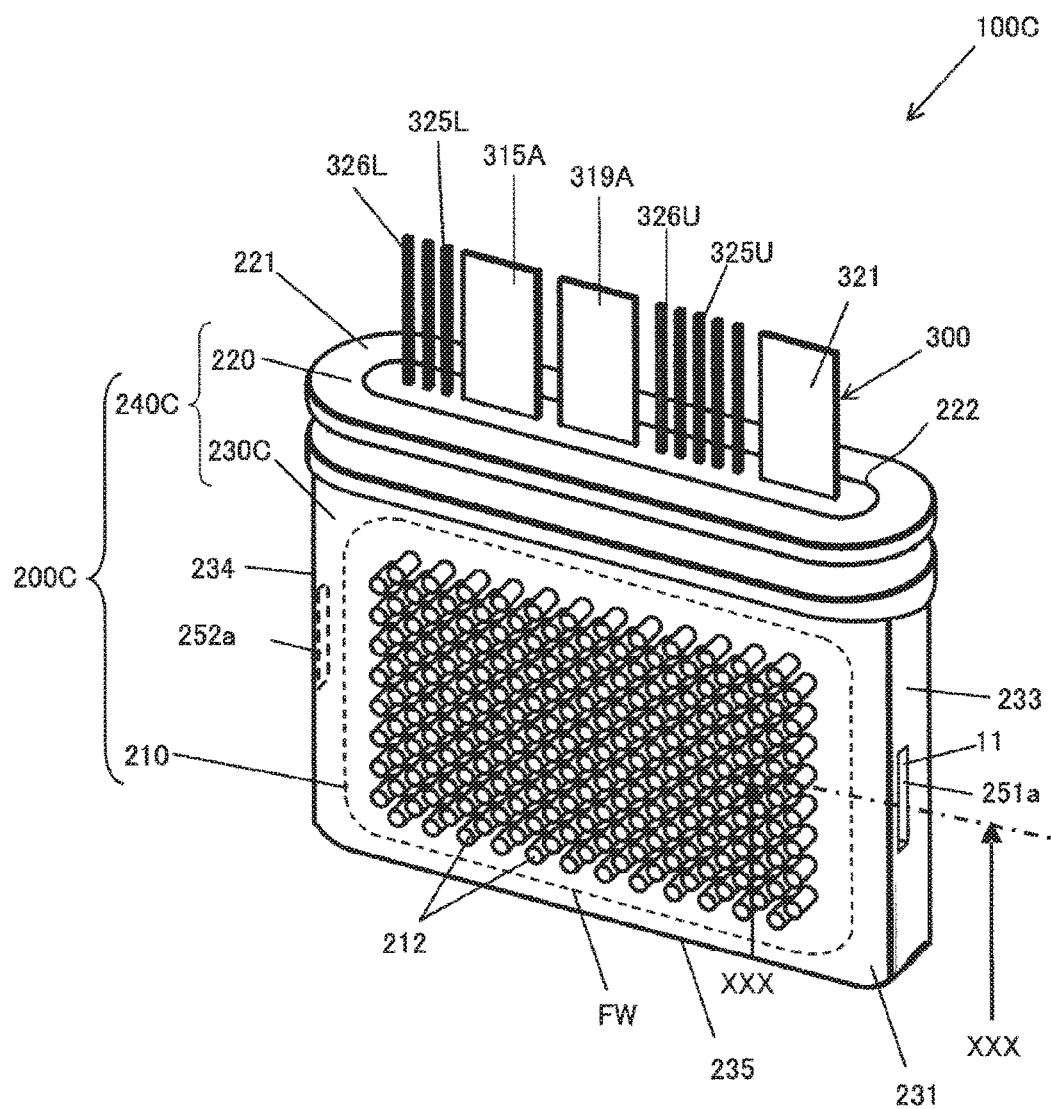
FIG. 29 is an appearance perspective view of a power semiconductor module according to a fourth embodiment of the present invention.
Figure 30:
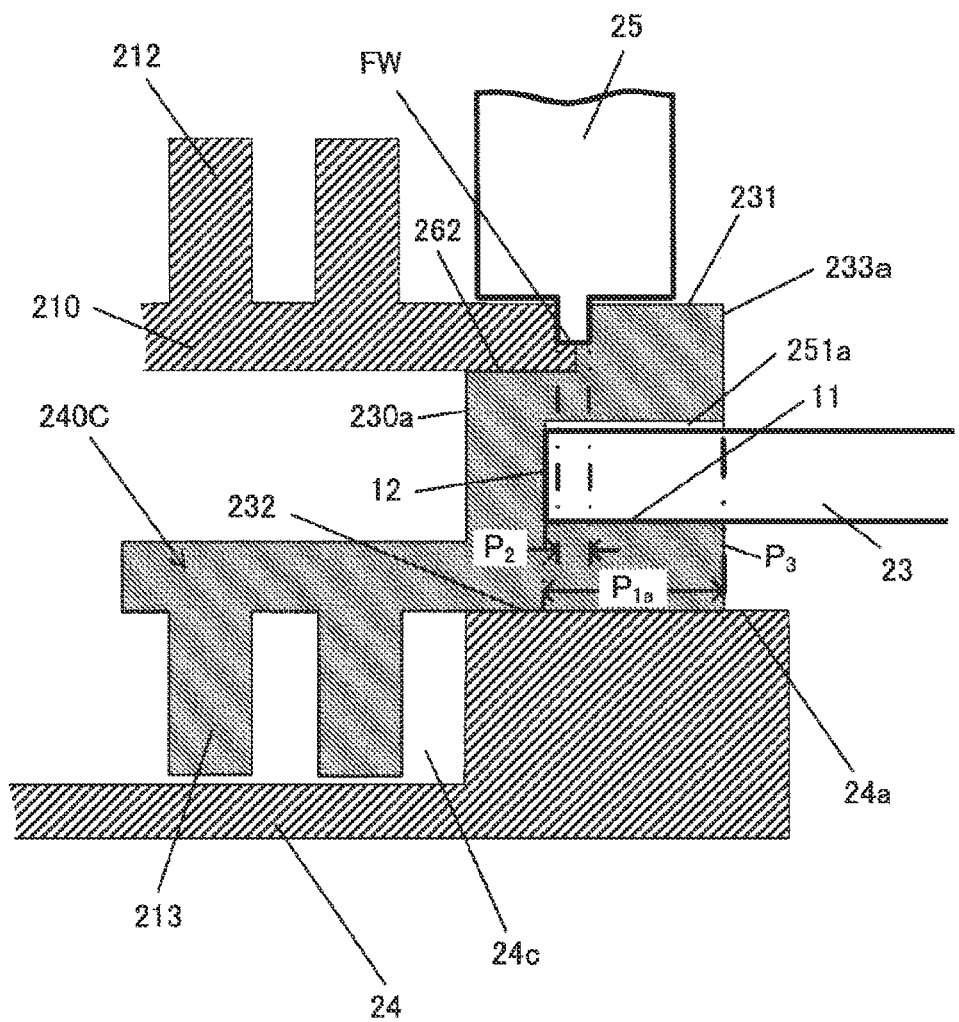
FIG. 30 is a sectional view on the XXX-XXX line of FIG. 29.

FIG. 29 is an appearance perspective view of a power semiconductor module according to the fourth embodiment of the present invention. FIG. 30 is a sectional view on the XXX-XXX line of FIG. 29.

In a power semiconductor module 100C of the fourth embodiment, first and second concaved parts 251a, 252a formed in a case component 200C is opened only in a side surface 233 or a side surface 234 of a frame case 240C, and is not opened in a front surface 231 and a back surface 232. The height (length in the Z-direction) of the first and second concaved parts 251a, 252a are formed larger than the thickness of a fixture 23.

In order to fix the frame case 240C, as illustrated in FIG. 30, the fixture 23 is moved toward the frame case 240C side in the length direction (X-direction) from the outside of the side surfaces 233, 234, and is inserted into the first concaved part 251a or the second concaved part 252a. Then the fixture 23 is descended in the thickness direction (Z-direction) for fixing the frame case 240C. The frame case 240C can be fixed in the length direction (X-direction) also by contacting a front tip surface of the fixture 23 to the side end surface 12 of the first and second concaved parts 251a, 252a. The frame case 240C can be fixed in the height direction (Y-direction) by contacting a side surface of the fixture 23 to the end surfaces 13, 14 of the first and second concaved parts 251a, 252a. The frame case 240C can be fixed in one of or both of the length direction (X-direction) and the height direction (Y-direction) using the other fixture by pressing the frame case 240C from the side surface, the upper surface, or the under surface thereof.

As illustrated in FIG. 30, when it is projected from thickness direction (Z-direction), the projection part $P_{1a}$ of the first concaved part 251a is prolonged to the inside of the projection part $P_2$ of the joining part FW. That is, the X-direction side end surface 12 of the first concaved part 251a is positioned inside the joining part FW. The second concaved part 252a has the similar structure. Since the first concaved parts 251a, 252a are not opened in the front surface 231 of the frame case 240C and is formed under the front surface 231, the concaved parts do not harm the joining using the joining tool 25.

When it is projected from the thickness direction (Z-direction) of the frame case 240, the projection part $P_{1a}$ of the first concaved part 251a is arranged overlapping the side 233a of the side surface 233 similarly to the first through third embodiments.

Since other configurations in the fourth embodiment are the same to the first embodiment, same reference numbers will be given to the corresponding components, and the explanations thereof are omitted.

Also in the fourth embodiment, the first and second concaved parts 251a, 252a are provided in the side surfaces 233, 234 of the frame case 240C, and the bottom surfaces 11 of the first and second concaved part 251a, 252a can be pressed in the thickness direction (Z-direction) using the fixture 23 for the fixation. The metal base 210 and the frame case 240C can be joined in this fixation state. Therefore, the advantage (1) of the first embodiment can be achieved.

Further, in the fourth embodiment, the length direction (X-direction) side end surface 12 of the first and second concaved parts 251a, 252a is positioned inside the joining part FW. Thus, the length between the opening part of the front surface 231 and the side surfaces 233, 234 can be made smaller in the frame case 240C compared to the first through third embodiments. This allows a further downsizing of the case component 200.

The fourth embodiment mentioned above exemplifies a power semiconductor module equipped with the case component 200C formed with the first and second concaved parts 251a, 252a in the front surface 231 side of the side surfaces 233, 234 of the frame case 240C. However, the first concaved part 251 through the fourth concaved part 254 of the second or third embodiment can have the same structure with the first and second concaved parts 251a, 252a of the fourth embodiment.

In each embodiment above, the side surfaces 233, 234 are exemplified having the structures with circularly curved geometries. However, the side surfaces 233, 234 can be in flat geometries.

In each embodiment above, case components 200, 200A through 200C are exemplified having the structure equipping the radiating fins 212, 213. However, the case components 200, 200A through 200C may not be equipped with the radiating fins 212, 213.

In the above mentioned embodiments, the circuit unit 300 is exemplified having a structure equipping two semiconductor blocks formed by sandwiching the semiconductor element with a pair of conductor boards. However, it is applicable also when the circuit unit 300 has one, or three or more semiconductor blocks. The semiconductor block can have a structure arranged with the conductor board only in one surface side of the semiconductor element. The structure of the semiconductor block shall not be limited to the above mentioned embodiments.

The present invention is applicable to a power semiconductor module including a circuit unit 300 equipped with a power converting circuit such as an inverter circuit and a converter circuit.

In each embodiment above, the first concaved part 251 through the fourth concaved part 254 are exemplified having the structures formed only in the side surfaces 233, 234. However, a concaved part other than the first concaved part 251 through the fourth concaved parts 254 can be formed in the under surfaces 235 of the case components 200, 200A through 200C.

Further, the power semiconductor module of the present invention can be modified variously within the scope of the spirit of the invention. The essential point is that the power semiconductor module shall have a case component formed with a concaved parts, wherein the concaved parts are formed in each of a pair of side surfaces of the frame case facing each other, the concaved parts are prolonged toward inside the casing component from the side surfaces, and the concaved part includes a bottom surface formed facing the joining part side in an intermediate position of the thickness direction of the side surface.

REFERENCE SIGNS LIST 11 bottom
12 side end surface
13, 14 end surface
23 fixture
24 receiving fixture
25 joining tool
100, 100A to 100C power semiconductor module
200, 200A to 200C case component
210, 210A, 210B metal base
212, 213 radiating fin
220 flange part
222 penetration hole
230, 230A to 230C frame part
231 front surface
232 back surface
233, 234 side surface
235 under surface
240, 240A to 240C frame case
261, 263 opening part
262 step part
251, 251a first concaved part
252, 252a second concaved part
253 third concaved part
254 fourth concaved part
300 circuit unit
FW, FWa, FWb joining part

The invention claimed is:

1. A power semiconductor module comprising:
a circuit unit including a first electrode for an input signal, a second electrode for an output signal, and a third electrode for a control signal, wherein the circuit unit further includes a power converting circuit that converts the input signal of the first electrode based on the control signal applied to the third electrode and outputs the output signal from the second electrode; and
a case component, including a frame case made of metal and a metal base, that accommodates the circuit unit, wherein
the frame case includes a front surface, a back surface, and a pair of side surfaces, wherein the frame case is formed with an opening part at least in one of the front surface or the back surface,
the case component includes a joining part in which a peripheral part of the metal base inserted into the opening part of the frame case and the peripheral part of the opening part of the frame case are joined, and
each of the pair of side surfaces of the frame case is formed with a concaved part, wherein the concaved part is prolonged toward an inner side of the case component from the side surface and includes a bottom surface formed facing a joining part side in an intermediate position of a thickness direction of the side surface.

2. The power semiconductor module according to claim 1, wherein when projected from a thickness direction of the frame case,
a projection part of the concaved part is positioned outside of a projection part of the joining part.

3. The power semiconductor module according to claim 2, wherein
the bottom surface of the concaved part is opened in the front surface.

4. The power semiconductor module according to claim 1, wherein
the frame case includes the opening part formed respectively in each of the front surface and the back surface,
the metal base includes a first metal base inserted into the opening part of the front surface, and a second metal base inserted into the opening part of the back surface,
the case component includes a first joining part in which a peripheral part of the first metal base inserted into the opening part in the front surface of the frame case and the peripheral part of the opening part of the front surface are joined, and a second joining part in which a peripheral part of the second metal base inserted into the opening part of the back surface and the peripheral part of the opening part of the back surface are joined, and
each of the pair of side surfaces of the frame case is formed respectively with a first concaved part and a second concaved part that are prolonged toward an inner side of the case component from the side surface, wherein the first concaved part includes a bottom surface formed facing a first joining part side in an intermediate position of the thickness direction of the side surface, and the second concaved part includes a bottom surface formed facing a second joining part side in an intermediate position of the thickness direction of the side surface.

5. The power semiconductor module according to claim 4, wherein
the distance between the first joining part and the bottom surface of the first concaved part is smaller than the distance between the first joining part and the bottom surface of the second concaved part,
the distance between the second joining part and the bottom surface of the second concaved part is smaller than the distance between the second joining part and the bottom surface of the first concaved part, and
a partition part is intervened between the bottom surface of the first concaved part and the bottom surface of the second concaved part.

6. The power semiconductor module according to claim 5, wherein
the first concaved part and the second concaved part are formed in positions shifted along a side surface direction of the frame case, and
the side surface includes a region where the first concaved part is not formed between the front surface and the bottom surface of the second concaved part, and a region where the second concaved part is not formed between the back surface and the bottom surface of the first concaved part.

7. The power semiconductor module according to claim 4, wherein
the first concaved part and the second concaved part formed in respective side surfaces of the frame case are formed with geometries and numbers such that, when the case component is flipped centering a direction parallel to a central axis of the pair of side surfaces of the frame case, the position of one of the concaved parts is in the same position as the other concaved part before being flipped.

8. A manufacturing method of the power semiconductor module claim 4, comprising the processes of:
inserting the first metal base into the opening part in the front surface of the frame case;
fixing the bottom surface of the first concaved part formed in respective side surface of each of the pair of the side surfaces of the frame case using a fixture to at least in the thickness direction of the side surface;
joining the peripheral part of the opening part in the front surface of the frame case and the peripheral part of the first metal base;
flipping the frame case joined with the first metal base centering a direction parallel to a central axis of the pair of side surfaces of the frame case;
inserting the second metal base into the opening part in the back surface of the frame case;
fixing the bottom surface of the second concaved part formed in respective side surface of each of the pair of the side surfaces of the frame case using a fixture at least in the thickness direction of the side surface;
joining the peripheral part of the opening part in the back surface of the frame case and the peripheral part of the second metal base to form the case component; and
accommodating the circuit unit in the case component.

9. A manufacturing method of the power semiconductor module claim 1, comprising the processes of:
inserting the metal base into the opening part of the front surface of the frame case;
fixing the bottom surface of the concaved part formed in each of the pair of the side surfaces of the frame case using a fixture at least in the thickness direction of the side surface;
joining the peripheral part of the opening part of the frame case and the peripheral part of the metal base to form the case component; and
accommodating the circuit unit in the case component.

10. A power semiconductor module comprising:
a power semiconductor element that converts direct current power into alternating current power; and
a case component that accommodates the power semiconductor element, wherein
the case component includes a metal frame case and a metal base, and
the frame case includes a joining part joined to a peripheral part of the metal base, a side surface connected with a surface formed with the joining part, and a concaved part having a bottom formed in the side surface, wherein
a bottom surface of the concaved part is open in a stack direction of the metal base and a frame part of the frame case.

11. A case component for accommodating a power semiconductor element which converts a direct current power into an alternating current power, comprising:
a metal frame case; and
a metal base, wherein
the frame cases includes a joining part joined to a peripheral part of the metal base, a side surface connected with a surface formed with the joining part, and a concaved part having a bottom formed in the side surface, wherein, a bottom surface of the concaved part is open in a stack direction of the metal base and a frame part of the frame case.

* * * * *